US010095084B2

(12) United States Patent
Kobayashi et al.

(10) Patent No.: US 10,095,084 B2
(45) Date of Patent: Oct. 9, 2018

(54) SOLID-STATE LASER SYSTEM AND EXCIMER LASER SYSTEM

(71) Applicants: The University of Tokyo, Tokyo (JP); GIGAPHOTON INC., Tochigi (JP)

(72) Inventors: Yohei Kobayashi, Tokyo (JP); Shinji Ito, Tochigi (JP)

(73) Assignees: The University of Tokyo, Tokyo (JP); Gigaphoton Inc., Tochigi (JP)

( * ) Notice: Subject to any disclaimer, the term of this patent is extended or adjusted under 35 U.S.C. 154(b) by 0 days.

(21) Appl. No.: 15/912,004

(22) Filed: Mar. 5, 2018

(65) Prior Publication Data

US 2018/0196330 A1 Jul. 12, 2018

Related U.S. Application Data

(63) Continuation of application No. PCT/JP2015/079151, filed on Oct. 15, 2015.

(51) Int. Cl.
*G02F 1/37* (2006.01)
*H01S 3/30* (2006.01)
(Continued)

(52) U.S. Cl.
CPC ............... *G02F 1/37* (2013.01); *H01S 3/067* (2013.01); *H01S 3/30* (2013.01); *G02F 2001/354* (2013.01)

(58) Field of Classification Search
CPC ...... G02F 1/37; G02F 2001/354; H01S 3/067; H01S 3/30
See application file for complete search history.

(56) References Cited

U.S. PATENT DOCUMENTS 5,696,778 A * 12/1997 MacPherson ........... H01S 3/305
372/10
6,498,801 B1 * 12/2002 Dudelzak ................ G02F 1/353
372/22
(Continued)

FOREIGN PATENT DOCUMENTS

JP 2007-086108 A 4/2007
JP 2008-511182 A 4/2008
(Continued)

OTHER PUBLICATIONS

International Search Report issued in PCT/JP2015/079151; dated Jan. 12, 2016.
(Continued)

*Primary Examiner* — Daniel Petkovsek
(74) *Attorney, Agent, or Firm* — Studebaker & Brackett PC

(57) ABSTRACT

A solid-state laser system may include: a solid-state laser unit configured to output first pulsed laser light with a first wavelength and second pulsed laser light with a second wavelength; a first solid-state amplifier configured to receive the first pulsed laser light, and output third pulsed laser light with the first wavelength; a wavelength converter configured to receive the third pulsed laser light, and output harmonic light with a third wavelength; a second solid-state amplifier configured to receive the second pulsed laser light, and output fourth pulsed laser light with the second wavelength; a Raman laser unit configured to receive the fourth pulsed laser light, and output Stokes light with a fourth wavelength; and a wavelength conversion system configured to receive the harmonic light and the Stokes light, and output fifth pulsed laser light with a fifth wavelength converted in wavelength from the third wavelength and the fourth wavelength.

15 Claims, 11 Drawing Sheets

(51) Int. Cl.
*H01S 3/067* (2006.01)
*G02F 1/35* (2006.01)

(56) References Cited

U.S. PATENT DOCUMENTS

| | | | |
|---|---|---|---|
| 7,593,437 B2 | 9/2009 | Staroudoumov et al. | |
| 7,593,440 B2* | 9/2009 | Spinelli | H01S 3/1304 372/21 |
| 7,627,007 B1* | 12/2009 | Armstrong | G02F 1/3501 372/21 |
| 8,634,441 B2* | 1/2014 | Onose | H01S 3/0085 372/21 |
| 9,529,182 B2* | 12/2016 | Chuang | G02B 17/0892 |
| 9,812,841 B2 | 11/2017 | Onose et al. | |
| 9,837,787 B2* | 12/2017 | Spence | H01S 3/30 |
| 9,929,529 B2* | 3/2018 | Onose | H01S 3/10 |
| 2005/0163169 A1* | 7/2005 | Lawandy | H01S 3/16 372/3 |
| 2008/0225288 A1 | 9/2008 | Rice et al. | |
| 2013/0077086 A1* | 3/2013 | Chuang | G01N 21/9501 356/51 |
| 2017/0338617 A1* | 11/2017 | Zhao | H01S 3/06754 |
| 2018/0109065 A1* | 4/2018 | Sasaki | H01S 3/08063 |

FOREIGN PATENT DOCUMENTS

| | | |
|---|---|---|
| JP | 2009-535666 A | 10/2009 |
| JP | 2011-128330 A | 6/2011 |
| WO | 2006/026540 A2 | 3/2006 |
| WO | 2007/127356 A2 | 11/2007 |
| WO | 2015/140901 A1 | 9/2015 |

OTHER PUBLICATIONS

International Preliminary Report on Patentability; issued in PCT/JP2015/079151; dated Apr. 17, 2018.

Sabella et al., "Efficient conversion of a 1.064μm Nd: YAG laser to the eye-safe region using a diamond Raman laser", Optics Express, Nov. 7, 2011, pp. 23554-23560, vol. 19, No. 23.

Xuan et al., "300-mW narrow-linewidth deep-ultraviolet light generation at 193 nm by frequency mixing between Yb-hybrid and Er-fiber lasers", Optics Express, Apr. 20, 2015, pp. 10564-10572, vol. 23, No. 8.

* cited by examiner

| | WAVELENGTH OF SEED LIGHT S1 (nm) | WAVELENGTH OF PULSED LASER LIGHT LH (nm) | WAVELENGTH OF SEED LIGHT S2 (nm) | WAVELENGTH OF PULSED LASER LIGHT LS (nm) | WAVELENGTH OF PULSED LASER LIGHT LL (nm) |
|---|---|---|---|---|---|
| EXAMPLE 1 | 1040 | 260 | 1077 | 1510.7 | 193.4 |
| EXAMPLE 2 | 1040 | 260 | 1088 | 1531.4 | 194 |
| EXAMPLE 3 | 1040 | 260 | 1070 | 1496.0 | 193 |
| EXAMPLE 4 | 1037 | 259.25 | 1077 | 1509.8 | 193 |
| EXAMPLE 5 | 1045 | 261.25 | 1077 | 1509.8 | 194 |
| EXAMPLE 6 | 1037 | 259.25 | 1093 | 1541.3 | 194 |
| EXAMPLE 7 | 1037 | 259.25 | 1084 | 1523.5 | 193.4 |
| EXAMPLE 8 | 1032 | 258 | 1088 | 1531.4 | 193 |

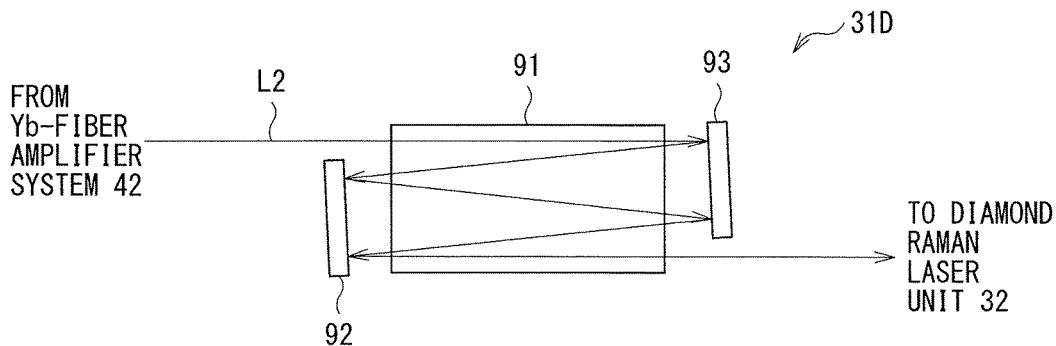

FIG. 9A

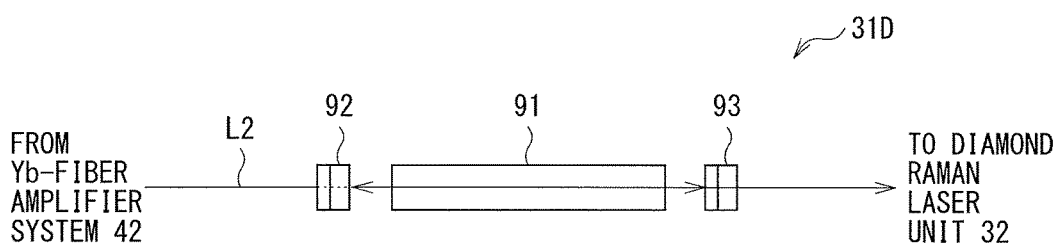

FIG. 9B

| MATERIAL GROUP A THAT CAN AMPLIFY PULSED LASER LIGHT WITH WAVELENGTH OF ABOUT 1040 nm AND WITH WAVELENGTH OF ABOUT 1077 nm | MATERIAL GROUP B THAT CAN AMPLIFY PULSED LASER LIGHT WITH WAVELENGTH OF ABOUT 1040 nm |
|---|---|
| Yb:Lu$_2$O$_3$ | Yb:Sc$_2$O$_3$ |
| Yb:LuScO$_3$ | Yb:CaF$_2$ |
| Yb:(Lu, Y, Sc)$_2$O$_3$ ⟨Yb:ScYLO⟩ | Yb:LiYF$_4$ ⟨Yb:YLF⟩ |
| Yb:YScO$_3$ | Yb:KGd(WO$_4$)$_2$ ⟨Yb:KGW⟩ |
| Yb:Y$_2$O$_3$ | Yb:KY(WO$_4$)$_2$ ⟨Yb:KYW⟩ |
| Yb:Lu$_2$SiO$_5$ | Yb:Y$_3$Al$_5$O$_{12}$ ⟨Yb:YAG⟩ |

FIG. 10

SOLID-STATE LASER SYSTEM AND EXCIMER LASER SYSTEM

CROSS-REFERENCE TO RELATED APPLICATIONS

The present application is a continuation application of International Application No. PCT/JP2015/079151 filed on Oct. 15, 2015. The content of the application is incorporated herein by reference in its entirety.

The present disclosure relates to a solid-state laser system configured to generate pulsed laser light and to an excimer laser system.

The miniaturization and increased levels of integration of semiconductor integrated circuits have led to a demand for increased resolutions of semiconductor exposure apparatuses, which will be simply referred to as "exposure apparatuses" hereinafter. As such, advances are being made to reduce the wavelength of light outputted from exposure light sources. In place of existing mercury lamps, gas laser apparatuses are being used as exposure light sources. Currently, KrF excimer laser apparatuses that output ultraviolet radiation with a wavelength of 248 nm and ArF excimer laser apparatuses that output ultraviolet radiation with a wavelength of 193 nm are being used as gas laser apparatuses for exposure.

As a current exposure technology, immersion exposure is in practical use. In immersion exposure, the apparent wavelength of an exposure light source is reduced by filling the space between a projection lens in an exposure apparatus and a wafer with a liquid and thus by changing the refractive index of that space. In a case where immersion exposure is performed with the use of an ArF excimer laser apparatus as the exposure light source, a wafer is irradiated with ultraviolet light with a wavelength of 134 nm in water. This technology is referred to as ArF immersion exposure. ArF immersion exposure is also referred to as ArF immersion lithography.

The spectral linewidth of spontaneous oscillation in KrF and ArF excimer laser apparatuses is as broad as about 350 pm to 400 pm, which thus leads to an occurrence of chromatic aberration in the laser light (e.g., ultraviolet light) reduced and projected onto a wafer by the projection lens in the exposure apparatus, resulting in reduced resolutions. This renders it necessary to narrow the spectral linewidth of the laser light outputted from the gas laser apparatus to such an extent that makes the chromatic aberration negligible. The spectral linewidth is also referred to as a spectral width. A line narrowing module (LNM) having a line narrowing device is provided in a laser resonator of a gas laser apparatus, and the spectral width is narrowed by the line narrowing module. Examples of the line narrowing device may include an etalon and a grating. A laser apparatus with its spectral width narrowed in this manner is referred to as a line narrowing laser apparatus. For example, reference is made to U.S. Pat. No. 7,593,437, U.S. Patent Application Publication No. 2008/0225288; Japanese Unexamined Patent Application Publication No. 2007-086108; Alexander Sabella, James A. Piper, and Richard P. Mildren, "Efficient conversion of a 1.064 μm Nd:YAG laser to the eye-safe region using a diamond Raman laser." OPTICS EXPRESS, volume 19, no. 23, 7 Nov. 2011, pp. 23554-23560; and Hongwen Xuan, Zhigang Zhao, Hironori Igarashi, Shinji Ito, Kouji Kakizaki, and Yohei Kobayashi, "300-mW narrow-linewidth deep-ultraviolet light generation at 193 nm by frequency mixing between Yb-hybrid and Er-fiber lasers." OPTICS EXPRESS, volume 23, no. 8, 20 Apr. 2015, pp. 10564-10572.

SUMMARY

A solid-state laser system according to one aspect of the present disclosure may include a solid-state laser unit, a first solid-state amplifier, a wavelength converter, a second solid-state amplifier, a Raman laser unit, and a wavelength conversion system. The solid-state laser unit may be configured to output first pulsed laser light with a first wavelength and second pulsed laser light with a second wavelength. The first solid-state amplifier may be configured to receive the first pulsed laser light, and output third pulsed laser light with the first wavelength. The wavelength converter may be configured to receive the third pulsed laser light, and output harmonic light with a third wavelength. The second solid-state amplifier may be configured to receive the second pulsed laser light, and output fourth pulsed laser light with the second wavelength. The Raman laser unit may be configured to receive the fourth pulsed laser light, and output Stokes light with a fourth wavelength. The wavelength conversion system may be configured to receive the harmonic light and the Stokes light, and output fifth pulsed laser light with a fifth wavelength converted in wavelength from the third wavelength and the fourth wavelength.

A solid-state laser system according to one aspect of the present disclosure may include a solid-state laser unit, a single solid-state amplifier, an optical device, a wavelength converter, a Raman laser unit, and a wavelength conversion system. The solid-state laser unit may be configured to output first pulsed laser light with a first wavelength and second pulsed laser light with a second wavelength. The single solid-state amplifier may be configured to receive the first pulsed laser light and the second pulsed laser light, and output third pulsed laser light with the first wavelength and fourth pulsed laser light with the second wavelength. The optical device may be provided downstream of the solid-state amplifier, and configured to branch the third pulsed laser light and the fourth pulsed laser light. The wavelength converter may be configured to receive the third pulsed laser light branched by the optical device, and output harmonic light with a third wavelength. The Raman laser unit may be configured to receive the fourth pulsed laser light branched by the optical device, and output Stokes light with a fourth wavelength. The wavelength conversion system may be configured to receive the harmonic light and the Stokes light, and output fifth pulsed laser light with a fifth wavelength converted in wavelength from the third wavelength and the fourth wavelength.

An excimer laser system according to one aspect of the present disclosure may include a solid-state laser unit, a first solid-state amplifier, a wavelength converter, a second solid-state amplifier, a Raman laser unit, a wavelength conversion system, and an excimer laser amplifier. The solid-state laser unit may be configured to output first pulsed laser light with a first wavelength and second pulsed laser light with a second wavelength. The first solid-state amplifier may be configured to receive the first pulsed laser light, and output third pulsed laser light with the first wavelength. The wavelength converter may be configured to receive the third pulsed laser light, and output harmonic light with a third wavelength. The second solid-state amplifier may be configured to receive the second pulsed laser light, and output fourth pulsed laser light with the second wavelength. The Raman laser unit may be configured to receive the fourth pulsed laser light, and output Stokes light with a fourth wavelength. The wavelength conversion system may be configured to receive the harmonic light and the Stokes light, and output fifth pulsed laser light with a fifth wavelength converted in wavelength from the third wavelength and the fourth wavelength. The excimer laser amplifier may be configured to receive the fifth pulsed laser light, and output pulsed laser light with the fifth wavelength.

An excimer laser system according to one aspect of the present disclosure may include a solid-state laser unit, a single solid-state amplifier, an optical device, a wavelength converter, a Raman laser unit, a wavelength conversion system, and an excimer laser amplifier. The solid-state laser unit may be configured to output first pulsed laser light with a first wavelength and second pulsed laser light with a second wavelength. The single solid-state amplifier may be configured to receive the first pulsed laser light and the second pulsed laser light, and output third pulsed laser light with the first wavelength and fourth pulsed laser light with the second wavelength. The optical device may be provided downstream of the solid-state amplifier, and configured to branch the third pulsed laser light and the fourth pulsed laser light. The wavelength converter may be configured to receive the third pulsed laser light branched by the optical device, and output harmonic light with a third wavelength. The Raman laser unit may be configured to receive the fourth pulsed laser light branched by the optical device, and output Stokes light with a fourth wavelength. The wavelength conversion system may be configured to receive the harmonic light and the Stokes light, and output fifth pulsed laser light with a fifth wavelength converted in wavelength from the third wavelength and the fourth wavelength. The excimer laser amplifier may be configured to receive the fifth pulsed laser light, and output pulsed laser light with the fifth wavelength.

BRIEF DESCRIPTION OF THE DRAWINGS

Hereinafter, several embodiments of the present disclosure will be described as mere examples with reference to the accompanying drawings.

FIG. 9A is a configuration diagram illustrating a configuration example of yet another Yb:solid-state amplifier according to the second modification example of the first embodiment.

FIG. 9B is another configuration diagram illustrating the configuration example of the Yb:solid-state amplifier illustrated in FIG. 9A.

FIG. 10 is a table summarizing examples of materials for Yb:solid-state amplifier according to a third modification example of the first embodiment.

DETAILED DESCRIPTION

Figure 1:
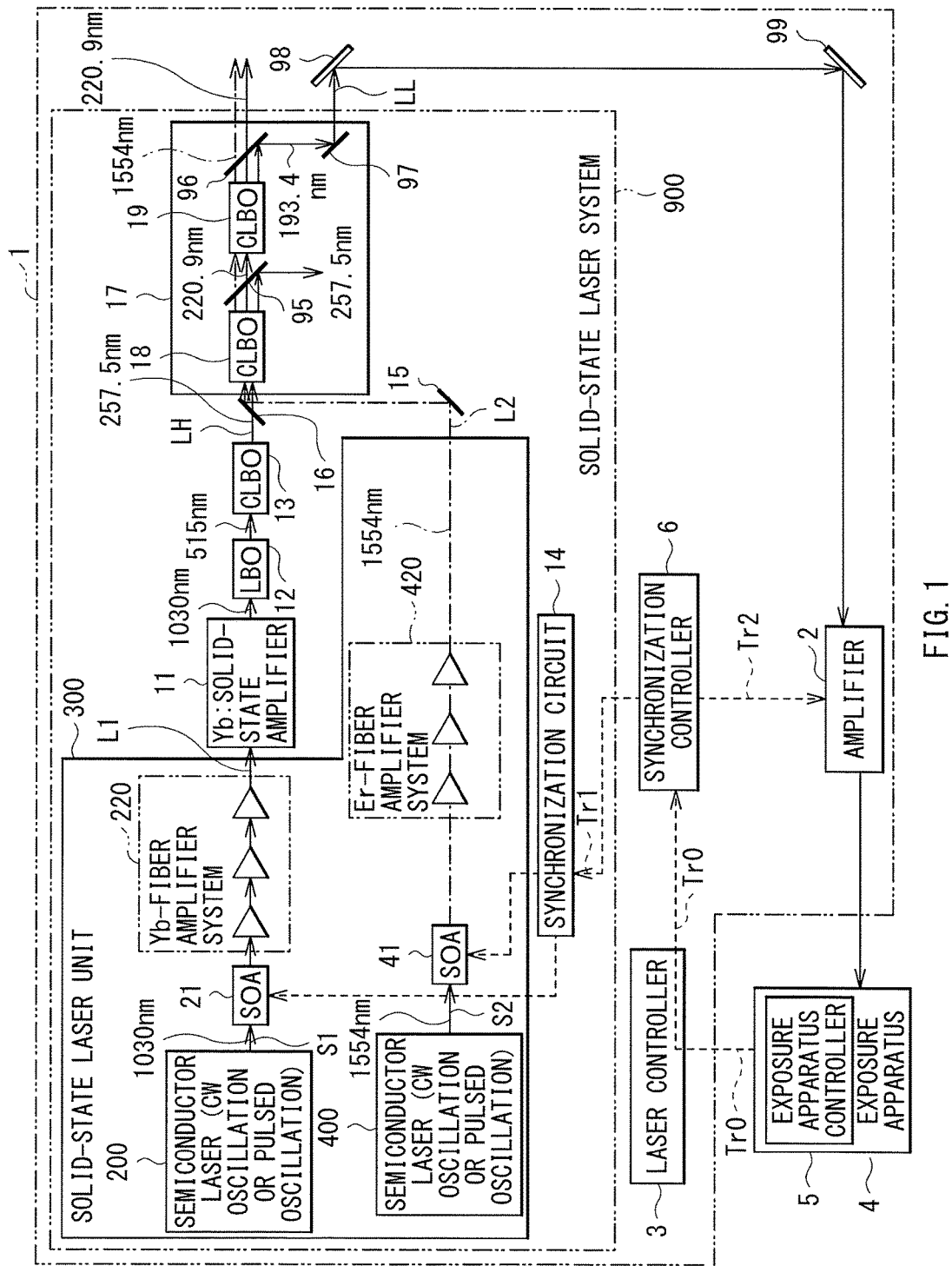
FIG. 1 is a configuration diagram schematically illustrating a configuration example of a laser apparatus, for use with an exposure apparatus, including a solid-state laser system according to a comparative example.

<Contents>
[1. Overview]
[2. Comparative Example] (Laser apparatus that includes solid-state laser system and is used with exposure apparatus)
2.1 Configuration (FIG. 1)
2.2 Operation
2.3 Issues
[3. First Embodiment] (Solid-state laser system)
3.1 Configuration (FIGS. 2 to 4)
3.2 Operation
3.3 Effect
3.4 Modification Examples
3.4.1 First Modification Example (FIG. 5)
3.4.2 Second Modification Example (FIGS. 6 to 8, 9A, and 9B)
3.4.3 Third Modification Example (FIG. 10)
3.4.4 Fourth Modification Example
3.4.5 Fifth Modification Example (FIGS. 11 and 12)
[4. Second Embodiment] (Solid-state laser system)
4.1 Configuration (FIG. 13)
4.2 Operation
4.3 Effect
4.4 Modification Examples
4.4.1 First Modification Example (FIGS. 14 and 15)
4.4.2 Second Modification Example
[5. Third Embodiment] (Solid-state laser system)
5.1 Configuration (FIG. 16)
5.2 Operation
5.3 Effect
[6. Hardware Environment of Controller] (FIG. 17)
[7. Et Cetera.]
Hereinafter, embodiments of the present disclosure will be described in detail with reference to the drawings.

Embodiments described hereinafter are several examples of the present disclosure and are not intended to limit the content of the present disclosure. In addition, not all of the configurations and the operations described in the embodiments are necessarily essential as the configurations and the operations of the present disclosure. It is to be noted that identical constituent elements are given identical reference characters, and duplicate descriptions thereof will be omitted.

1. Overview

The present disclosure relates, for example, to a solid-state laser system configured to generate pulsed laser light and to an excimer laser system.

2. Comparative Example

First, a laser apparatus that includes a solid-state laser system according to a comparative example with respect to the embodiments of the present disclosure will be described. This laser apparatus may be for use with an exposure apparatus.

The laser apparatus for an exposure apparatus may have configuration that includes a master oscillator (MO) and a power oscillator (PO). In such a laser apparatus for an exposure apparatus, an ArF laser unit, in which an ArF laser gas is used as a laser medium, may be used in the MO and the PO. However, from the viewpoint of energy efficiency, a laser apparatus for an exposure apparatus is being developed in which an MO is constituted by a solid-state laser system that outputs pulsed laser light with a wavelength of 193.4 nm. Such an MO may include a solid-state laser unit and a wavelength conversion system. Hereinafter, a configuration example of such a laser apparatus for an exposure apparatus will be described.

2.1 Configuration

FIG. 1 schematically illustrates a configuration example of a laser apparatus for an exposure apparatus according to a comparative example with respect to the embodiments of the present disclosure.

A laser apparatus 1 for an exposure apparatus may include a solid-state laser system 900, an amplifier 2, a laser controller 3, a synchronization controller 6, and high-reflection mirrors 98 and 99.

The solid-state laser system 900 may include a solid-state laser unit 300, a Yb:solid-state amplifier 11, an LBO (LiB$_3$O$_5$) crystal 12, a CLBO (CsLiB$_6$O$_{10}$) crystal 13, a synchronization circuit 14, a high-reflection mirror 15, a dichroic mirror 16, and a wavelength conversion system 17.

The solid-state laser unit 300 may be configured to output pulsed laser light L1 with a first wavelength generated from seed light S1 and output pulsed laser light L2 with a second wavelength generated from seed light S2. The first wavelength may be about 1030 nm, and the second wavelength may be about 1554 nm. The solid-state laser unit 300 may include a semiconductor laser 200, a semiconductor optical amplifier (SOA) 21, and a Yb-fiber amplifier system 220. The semiconductor laser 200, the semiconductor optical amplifier 21, and the Yb-fiber amplifier system 220 may be disposed in this order from the upstream toward the downstream in an optical path. The solid-state laser unit 300 may further include a semiconductor laser 400, a semiconductor optical amplifier (SOA) 41, and an Er-fiber amplifier system 420. The semiconductor laser 400, the semiconductor optical amplifier 41, and the Er-fiber amplifier system 420 may be disposed in this order from the upstream toward the downstream in an optical path.

The semiconductor laser 200 may be a distributed feedback (DFB) semiconductor laser that outputs the seed light S1 with a wavelength of about 1030 nm through continuous-wave (CW) oscillation or pulsed oscillation. The semiconductor laser 200 may be a single-longitudinal-mode semiconductor laser with variable wavelengths around the wavelength of about 1030 nm.

The semiconductor optical amplifier 21 may be a semiconductor device that, upon a pulsed current being passed to the semiconductor, amplifies and converts the seed light S1 to pulsed laser light having a predetermined pulse width. The semiconductor optical amplifier 21 may include a current controller that passes a pulsed current to the semiconductor in accordance with an instruction from the synchronization circuit 14. The semiconductor optical amplifier 21 may be configured to operate in synchronization with the semiconductor laser 200 in a case where the semiconductor laser 200 oscillates in pulses.

The Yb-fiber amplifier system 220 may include Yb-doped multi-stage optical fiber amplifiers and a CW excitation semiconductor laser that outputs excitation light through CW oscillation and supplies the excitation light to each optical fiber amplifier. The length of the optical fibers in the Yb-fiber amplifier system 220 may be regulated to such a length at which it is possible to suppress stimulated Brillouin scattering (SBS), which is a nonlinear phenomenon within an optical fiber.

The semiconductor laser 400 may be a distributed feedback semiconductor laser that outputs the seed light S2 with a wavelength of about 1554 nm through CW oscillation or pulsed oscillation. The semiconductor laser 400 may be a single-longitudinal-mode semiconductor laser with variable wavelengths around the wavelength of about 1554 nm.

The semiconductor optical amplifier 41 may be a semiconductor device that, upon a pulsed current being passed to the semiconductor, amplifies and converts the seed light S2 to pulsed laser light having a predetermined pulse width. The semiconductor optical amplifier 41 may include a current controller (not illustrated) that passes a pulsed current to the semiconductor in accordance with an instruction from the synchronization circuit 14. The semiconductor optical amplifier 41 may be configured to operate in synchronization with the semiconductor laser 400 in a case where the semiconductor laser 400 oscillates in pulses.

The Er-fiber amplifier system 420 may include Er- and Yb-doped multi-stage optical fiber amplifiers and a CW excitation semiconductor laser that outputs excitation light through CW oscillation and supplies the excitation light to each optical fiber amplifier.

The synchronization circuit 14 may be configured to output a predetermined trigger signal to each of the semiconductor optical amplifier 21 and the semiconductor optical amplifier 41 in accordance with a trigger signal Tr1 from the synchronization controller 6.

The Yb:solid-state amplifier 11 may include one of a Yb-doped crystal and a Yb-doped ceramic. The LBO crystal 12 may be a nonlinear crystal. The LBO crystal 12 may receive the pulsed laser light with the first wavelength outputted from the Yb:solid-state amplifier 11 and output pulsed laser light that is second-harmonic light of the received pulsed laser light. The CLBO crystal 13 may be a nonlinear crystal and may output pulsed laser light LH with a third wavelength that is fourth-harmonic light. The third wavelength may be about 257.5 nm. The Yb:solid-state amplifier 11, the LBO crystal 12, and the CLBO crystal 13 may be disposed in this order in an optical path downstream of the Yb-fiber amplifier system 220.

The high-reflection mirror 15 may be disposed to reflect, with high reflectance, the pulsed laser light L2 with the second wavelength outputted from the solid-state laser unit 300 and to cause the pulsed laser light reflected with high reflectance to enter the dichroic mirror 16.

The dichroic mirror 16 may be an optical device in which a substrate that transmits, with high transmittance, the pulsed laser light LH with the third wavelength is coated with a film. The film may transmit, with high transmittance, the pulsed laser light LH with the third wavelength and reflect, with high reflectance, the pulsed laser light L2 with the second wavelength. The dichroic mirror 16 may be disposed to cause the pulsed laser light LH and the pulsed laser light L2 to enter the wavelength conversion system 17 in a state in which the optical path axes of the pulsed laser light LH and the pulsed laser light L2 substantially coincide with each other.

The wavelength conversion system 17 may be configured to receive the pulsed laser light LH with the third wavelength and the pulsed laser light L2 with the second wavelength and output pulsed laser light LL with a wavelength different from both the second wavelength and the third wavelength. The wavelength conversion system 17 may include CLBO crystals 18 and 19, dichroic mirrors 95 and 96, and a high-reflection mirror 97. The CLBO crystal 18, the dichroic mirror 95, the CLBO crystal 19, and the dichroic mirror 96 may be disposed in this order from the upstream toward the downstream in an optical path.

The CLBO crystal 18 may receive the pulsed laser light LH with a wavelength of about 257.5 nm and the pulsed laser light L2 with a wavelength of about 1554 nm. The CLBO crystal 18 may output pulsed laser light with a wavelength of about 220.9 nm corresponding to the sum frequency of the wavelength of about 257.5 nm and the wavelength of about 1554 nm.

The dichroic mirror 95 may be an optical device coated with a film. The film may transmit, with high transmittance, the pulsed laser light with a wavelength of about 1554 nm and the pulsed laser light with a wavelength of about 220.9 nm and reflect, with high reflectance, the pulsed laser light with a wavelength of about 257.5 nm.

The CLBO crystal 19 may receive the pulsed laser light with a wavelength of about 1554 nm and the pulsed laser light with a wavelength of about 220.9 nm that have been transmitted through the dichroic mirror 95. The CLBO crystal 19 may output pulsed laser light with a wavelength of about 193.4 nm corresponding to the sum frequency of the wavelength of about 1554 nm and the wavelength of about 220.9 nm.

The dichroic mirror 96 may be an optical device coated with a film. The film may transmit, with high transmittance, the pulsed laser light with a wavelength of about 1554 nm and the pulsed laser light with a wavelength of about 220.9 nm and reflect, with high reflectance, the pulsed laser light with a wavelength of about 193.4 nm.

The high-reflection mirror 97 may be disposed to reflect, with high reflectance, the pulsed laser light with a wavelength of about 193.4 nm reflected by the dichroic mirror 96 and to output the pulsed laser light reflected with high reflectance from the solid-state laser system 900 as the pulsed laser light LL.

The high-reflection mirrors 98 and 99 may be disposed to cause the pulsed laser light LL with a wavelength of about 193.4 nm outputted from the solid-state laser system 900 to enter the amplifier 2.

The amplifier 2 may be configured to amplify the pulsed laser light LL with a wavelength of about 193.4 nm outputted from the solid-state laser system 900 and to output amplified pulsed laser light toward an exposure apparatus 4. The amplifier 2 may be an excimer laser amplifier. This excimer laser amplifier may be an ArF laser amplifier in which an ArF laser gas is used as a laser medium.

The laser controller 3 may be coupled to the semiconductor laser 200, the semiconductor laser 400, the CW excitation semiconductor laser in the Yb-fiber amplifier system 220, and the CW excitation semiconductor laser in the Er-fiber amplifier system 420 via signal lines (not illustrated).

The synchronization controller 6 may be supplied with an oscillation trigger signal Tr0 from the exposure apparatus 4 that serves as an external apparatus via the laser controller 3. The oscillation trigger signal Tr0 may instruct a generation timing of pulsed laser light in the solid-state laser system 900. The exposure apparatus 4 may include an exposure apparatus controller 5. The oscillation trigger signal Tr0 may be supplied by the exposure apparatus controller 5 of the exposure apparatus 4. The synchronization controller 6 may be configured to generate a trigger signal Tr1 in accordance with the oscillation trigger signal Tr0 and to supply the trigger signal Tr1 to the synchronization circuit 14. In addition, the synchronization controller 6 may be configured to generate a trigger signal Tr2 in accordance with the oscillation trigger signal Tr0 and to supply the trigger signal Tr2 to the amplifier 2.

2.2 Operation

The laser controller 3 may cause the semiconductor lasers 200 and 400 to undergo CW oscillation or pulsed oscillation in accordance with the oscillation trigger signal Tr0. In addition, the laser controller 3 may cause the CW excitation semiconductor laser in the Yb-fiber amplifier system 220 and the CW excitation semiconductor laser in the Er-fiber amplifier system 420 to undergo CW oscillation in accordance with the oscillation trigger signal Tr0.

The synchronization controller 6 may control a delay time between the oscillation trigger signal Tr0 and the trigger signal Tr1 and a delay time between the oscillation trigger signal Tr0 and the trigger signal Tr2, upon receiving the oscillation trigger signal Tr0 from the exposure apparatus controller 5 via the laser controller 3. These delay times may be controlled so that the amplifier 2 operates in synchronization with the entry, into the amplifier 2, of the pulsed laser light LL outputted from the solid-state laser system 900.

In the solid-state laser unit 300, the semiconductor laser 200 may output, as the seed light S1, CW oscillation light or pulsed oscillation light with a wavelength of about 1030 nm. The seed light S1 may be amplified and converted into pulsed laser light having a predetermined pulse width by the semiconductor optical amplifier 21 in accordance with a predetermined trigger signal from the synchronization circuit 14. The pulsed laser light outputted from the semiconductor optical amplifier 21 may enter the Yb-fiber amplifier system 220 and be amplified by the Yb-fiber amplifier system 220 with stimulated Brillouin scattering being suppressed. Thus, the solid-state laser unit 300 may output the pulsed laser light L1 with a wavelength of about 1030 nm.

The pulsed laser light L1 outputted from the solid-state laser unit 300 may enter the Yb:solid-state amplifier 11 and be amplified by the Yb:solid-state amplifier 11. The pulsed laser light outputted from the Yb:solid-state amplifier 11 may enter the LBO crystal 12. Then, the pulsed laser light LH with a wavelength of about 257.5 nm, which is fourth-harmonic light of the pulsed laser light entering the LBO crystal 12, may be generated and outputted through the LBO crystal 12 and the CLBO crystal 13.

In addition, in the solid-state laser unit 300, the semiconductor laser 400 may output, as the seed light S2, CW oscillation light or pulsed oscillation light with a wavelength of about 1554 nm. This seed light S2 may be amplified and converted into pulsed laser light having a predetermined pulse width by the semiconductor optical amplifier 41 in accordance with a predetermined trigger signal from the synchronization circuit 14. The pulsed laser light outputted from the semiconductor optical amplifier 41 may enter the Er-fiber amplifier system 420 and be amplified by the Er-fiber amplifier system 420. Thus, the solid-state laser unit 300 may output the pulsed laser light L2 with a wavelength of about 1554 nm.

The pulsed laser light LH with a wavelength of about 257.5 nm outputted from the CLBO crystal 13 may enter the wavelength conversion system 17 via the dichroic mirror 16. In addition, the pulsed laser light L2 with a wavelength of about 1554 nm outputted from the solid-state laser unit 300 may enter the wavelength conversion system 17 via the high-reflection mirror 15 and the dichroic mirror 16.

Here, the synchronization circuit 14 may supply trigger signals each having a predetermined pulse width to the respective semiconductor optical amplifiers 21 and 41 at predetermined timings in accordance with the trigger signal Tr1. These timings may be adjusted so that the pulsed laser light LH and the pulsed laser light L2 enter the CLBO crystal 18 in the wavelength conversion system 17 at substantially the same time. The pulse widths of the trigger signals supplied to the semiconductor optical amplifier 21 and the semiconductor optical amplifier 41 may each be adjusted so that the pulsed laser light LL outputted from the solid-state laser system 900 has a desired pulse width.

In the wavelength conversion system 17, the pulsed laser light LH and the pulsed laser light L2 may enter the CLBO crystal 18 at substantially the same time via the dichroic mirror 16, and the beam of the pulsed laser light LH and the beam of the pulsed laser light L2 may coalesce in the CLBO crystal 18. In the CLBO crystal 18, the pulsed laser light with a wavelength of about 220.9 nm corresponding to the sum frequency of the wavelength of about 257.5 nm and the wavelength of about 1554 nm may be generated. Three types of pulsed laser light, namely, the pulsed laser light with a wavelength of about 257.5 nm, the pulsed laser light with a wavelength of about 1554 nm, and the pulsed laser light with a wavelength of about 220.9 nm may be outputted from the CLBO crystal 18.

Of these three types of pulsed laser light outputted from the CLBO crystal 18, two types of pulsed laser light, namely, the pulsed laser light with a wavelength of about 1554 nm and the pulsed laser light with a wavelength of about 220.9 nm may be transmitted through the dichroic mirror 95 with high transmittance, and the pulsed laser light with a wavelength of about 257.5 nm may be reflected by the dichroic mirror 95 with high reflectance. The two types of pulsed laser light transmitted through the dichroic mirror 95 may enter the CLBO crystal 19.

In the CLBO crystal 19, the pulsed laser light LL with a wavelength of about 193.4 nm corresponding to the sum frequency of the wavelength of about 220.9 nm and the wavelength of about 1554 nm may be generated. Three types of pulsed laser light, namely, the pulsed laser light with a wavelength of about 1554 nm, the pulsed laser light with a wavelength of about 220.9 nm, and the pulsed laser light with a wavelength of about 193.4 nm may be outputted from the CLBO crystal 19.

Of these three types of pulsed laser light outputted from the CLBO crystal 19, the pulsed laser light with a wavelength of about 1554 nm and the pulsed laser light with a wavelength of about 220.9 nm may be transmitted through the dichroic mirror 96 with high transmittance, and the pulsed laser light with a wavelength of about 193.4 nm may be reflected by the dichroic mirror 96 with high reflectance. The pulsed laser light with a wavelength of about 193.4 nm may be reflected by the high-reflection mirror 97 with high reflectance and outputted from the wavelength conversion system 17 as the pulsed laser light LL.

The pulsed laser light LL outputted from the wavelength conversion system 17 may enter the amplifier 2 via the high-reflection mirrors 98 and 99. The pulsed laser light LL that has entered the amplifier 2 may be amplified by the amplifier 2 and outputted toward the exposure apparatus 4,

2.3 Issues

In a case where an MO is constituted with the use of the solid-state laser system 900 in this manner, the required specifications for the pulsed laser light LL from the solid-state laser system 900 may be as follows.
repetition frequency: ≤6 kHz
pulse energy: ≥165 μJ/pulse (1 W at 6 kHz)
spectral linewidth Δν: ≤4 GHz (0.50 pm at 193.4 nm) (full width at half maximum)
pulse width: 1 ns to 30 ns (full width at half maximum)
In order to achieve the above, the target specifications for the pulsed laser light L2 from the solid-state laser unit 300 may be as follows.
repetition frequency: ≤6 kHz
pulse energy: ≥820 μJ/pulse (4.9 \V at 6 kHz)
spectral linewidth Δν: ≤4 GHz (32.2 pm at 1554 nm) (full width at half maximum)
pulse width: 1 ns to 30 ns (full width at half maximum)
When such target specifications are to be achieved, stimulated Brillouin scattering may occur in the final-stage optical fiber amplifier in the Er-fiber amplifier system 420. Consequently, amplification of the pulsed laser light is reduced in the final-stage optical fiber amplifier, and this pulsed laser light may be scattered to result in returning light. In this case, the semiconductor laser 400 may be damaged.

In addition, there may be a case where a solid-state amplifier that amplifies pulsed laser light with a wavelength of about 1554 nm is provided in a stage downstream of the Er-fiber amplifier system 420 in order to increase the pulse energy. For such a solid-state amplifier, a solid-state amplifier constituted by Er- and Yb-doped glass may be available, for example. However, such a solid-state amplifier may have a low thermal conductivity, which thus may make it difficult to repeatedly output laser light having a high pulse energy. Consequently, the pulse energy of the pulsed laser light L2 may become limited.

Therefore, it may be difficult to achieve the solid-state laser system 900 that outputs the pulsed laser light LL having a wavelength of about 193.4 nm, having the spectral linewidth and the pulse width described above, and having a pulse energy of several watts.

3. First Embodiment

Now, a solid-state laser system according to a first embodiment of the present disclosure will be described. In the following, constituent elements that are substantially the same as those of the solid-state laser system 900 according to the comparative example illustrated in FIG. 1 are given identical reference characters, and descriptions thereof will be omitted as appropriate.

3.1 Configuration

Figure 2:
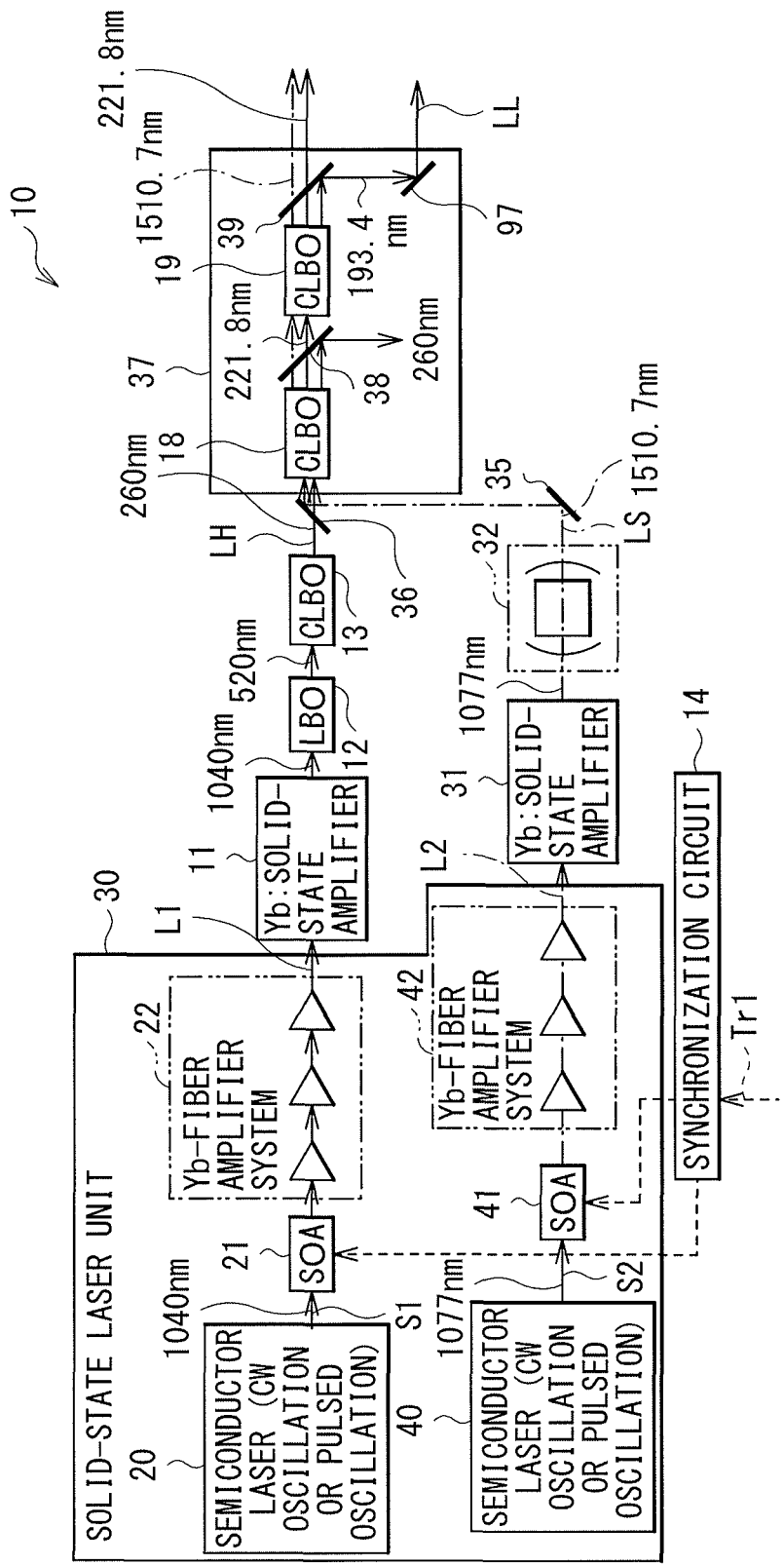
FIG. 2 is a configuration diagram schematically illustrating a configuration example of a solid-state laser system according to a first embodiment.

FIG. 2 schematically illustrates a configuration example of a solid-state laser system 10. The solid-state laser system 10 may include a solid-state laser unit 30, a Yb:solid-state amplifier 31, a diamond Raman laser unit 32, a high-reflection mirror 35, a dichroic mirror 36, and a wavelength conversion system 37.

The solid-state laser unit 30 may include a semiconductor laser 20, a semiconductor laser 40, and Yb-fiber amplifier systems 22 and 42.

The semiconductor laser 20 may be a distributed feedback semiconductor laser that outputs seed light S1 with a wavelength of about 1040 nm through CW oscillation or pulsed oscillation. The semiconductor laser 20 may be a single-longitudinal-mode semiconductor laser with variable wavelengths around the wavelength of about 1040 nm. The Yb-fiber amplifier system 22 may have a configuration similar to that of the Yb-fiber amplifier system 42, which will be described later. The semiconductor laser 20, a semiconductor optical amplifier 21, and the Yb-fiber amplifier system 22 may be disposed in this order from the upstream toward the downstream in an optical path. A Yb:solid-state amplifier 11, an LBO crystal 12, and a CLBO crystal 13 may be disposed in this order in an optical path of pulsed laser light L1 outputted from the solid-state laser unit 30. A third wavelength of pulsed laser light LH, which is fourth-harmonic light, outputted from the CLBO crystal 13 may be about 260 nm.

The semiconductor laser 40 may be a distributed feedback semiconductor laser that outputs seed light S2 with a wavelength of about 1077 nm through CW oscillation or pulsed oscillation. The semiconductor laser 40 may be a single-longitudinal-mode semiconductor laser with variable wavelengths around the wavelength of about 1077 nm. The semiconductor laser 40, a semiconductor optical amplifier 41, and the Yb-fiber amplifier system 42 may be disposed in this order from the upstream toward the downstream in an optical path.

Figure 3:
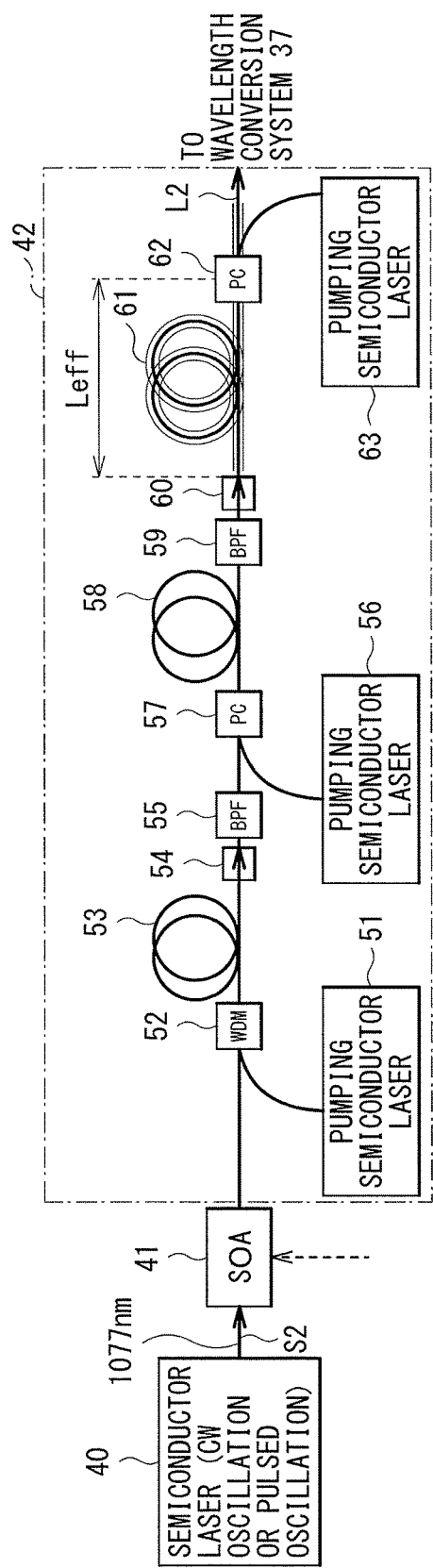
FIG. 3 is a configuration diagram schematically illustrating configuration example of a Yb-fiber amplifier illustrated in FIG. 2.

FIG. 3 schematically illustrates a configuration example of the Yb-fiber amplifier system 42. FIG. 3 illustrates, in addition to the Yb-fiber amplifier system 42, the semiconductor laser 40 and the semiconductor optical amplifier 41. The Yb-fiber amplifier system 42 may include Yb-fiber amplifiers 53, 58, and 61, isolators 54 and 60, and band-pass filters (BPFs) 55 and 59. The Yb-fiber amplifier 53, the isolator 54, the band-pass filter 55, the Yb-fiber amplifier 58, the band-pass filter 59, the isolator 60, and the Yb-fiber amplifier 61 may be disposed in this order from the upstream toward the downstream in an optical path. The Yb-fiber amplifier system 42 may further include pumping semiconductor lasers 51, 56, and 63, a wavelength division multiplexer (WDM) optical coupler 52, and pump combiners (PCs) 57 and 62. The Yb-fiber amplifier 53 and the Yb-fiber amplifier 58 may be coupled to each other via their respective fibers or may be coupled to each other with the air interposed therebetween. In a similar manner, the Yb-fiber amplifier 58 and the Yb-fiber amplifier 61 may be coupled to each other via their respective fibers or may be coupled to each other with the air interposed therebetween.

The Yb-fiber amplifier 53 may include a single-mode fiber (SMF) in which a silica fiber is doped with Yb. The fiber diameter of this single-mode fiber may be about 6 µm. The Yb-fiber amplifier 53 may be coupled at the upstream side thereof to an optical fiber coupled to the pumping semiconductor laser 51 via the WDM optical coupler 52. The WDM optical coupler 52 may be configured to couple the pulsed laser light with a wavelength of about 1077 nm outputted from the semiconductor optical amplifier 41 and pumping light with a wavelength of about 976 nm outputted from the pumping semiconductor laser 51.

The isolators 54 and 60 may be Faraday isolators for suppression of the passage of returning light, for example. Another isolator may further be provided between the semiconductor optical amplifier 41 and the WDM optical coupler 52.

The band-pass filters 55 and 59 may each be an optical device in which a glass substrate is coated with a filter. The filter may transmit, with high transmittance, the pulsed laser light with a wavelength of about 1077 nm and suppress the passage of other types of light. The other types of light may include amplified spontaneous emission (ASE) light and the pumping light.

The Yb-fiber amplifier 58 may include a double-clad fiber (DCF) in which a silica fiber is doped with Yb. The fiber diameter of this double-clad fiber may be about 10 µm. The Yb-fiber amplifier 58 may be coupled at the upstream side thereof to an optical fiber coupled to the pumping semiconductor laser 56 via the pump combiner 57. The pump combiner 57 may be configured to couple the pulsed laser light with a wavelength of about 1077 nm outputted from the Yb-fiber amplifier 53 in the preceding stage and pumping light with a wavelength of about 976 nm outputted from the pumping semiconductor laser 56.

The Yb-fiber amplifier 61 may include a double-clad fiber (DCF) in which a silica fiber is doped with Yb. This double-clad fiber may be a large-mode-area (LMA) fiber having a fiber diameter of about 25 µm or may be a photonic crystal fiber (PCF) having a fiber diameter of 40 µm. This double-clad fiber may be wound to approach a single-transverse mode. The Yb-fiber amplifier 61 may be coupled at the downstream side thereof to an optical fiber coupled to the pumping semiconductor laser 63 via the pump combiner 62. Alternatively, the Yb-fiber amplifier 61 may be coupled at the upstream side thereof to an optical fiber coupled to the pumping semiconductor laser 63 via the pump combiner 62. The pump combiner 62 may be configured to supply, to the Yb-fiber amplifier 61, pumping light with a wavelength of about 976 nm outputted from the pumping semiconductor laser 63. The effective amplifying fiber length Leff, which is the length of the portion of the Yb-fiber amplifier 61 through which the pumping light passes, may be set to such a length at which it is possible to suppress stimulated Brillouin scattering.

The Yb:solid-state amplifier 31 (FIG. 2) may include one of a Yb-doped crystal and a Yb-doped ceramic. The diamond Raman laser unit 32 may output pulsed laser light LS with a fourth wavelength, which is second-Stokes light. The fourth wavelength may be about 1510.7 nm. The Yb:solid-state amplifier 31 and the diamond Raman laser unit 32 may be disposed in this order in an optical path downstream of the Yb-fiber amplifier system 42, as illustrated in FIG. 2.

Figures 4, 5:
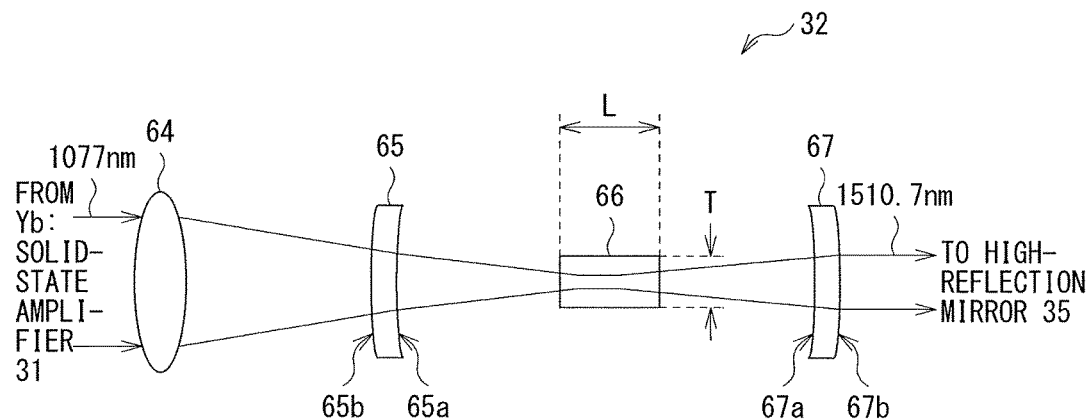
FIG. 4 is a configuration diagram schematically illustrating a configuration example of a diamond Raman laser amplifier illustrated in FIG. 2.
FIG. 5 is a table summarizing examples of the wavelength of each seed light and each pulsed laser light according to a first modification example of the first embodiment.

FIG. 4 schematically illustrates a configuration example of the diamond Raman laser unit 32. The diamond Raman laser unit 32 may include a condenser lens 64, an input coupler mirror 65, an output coupler mirror 67, and a diamond crystal 66. The input coupler mirror 65 and the output coupler mirror 67 may be disposed to oppose each other with the diamond crystal 66 interposed therebetween. The input coupler mirror 65 and the output coupler mirror 67 may constitute an optical resonator.

The condenser lens 64 may be disposed such that the pulsed laser light with the second wavelength outputted from the Yb:solid-state amplifier 31 is condensed inside the diamond crystal 66 via the input coupler mirror 65.

The input coupler mirror 65 may be an optical device having a surface 65a on the side closer to the diamond crystal 66. The surface 65a may constitute a concave mirror. The input coupler mirror 65 may be an optical device in which the surface 65a, on the side closer to the diamond crystal 66, of a substrate is coated with a film. The substrate may transmit, with high transmittance, light with a wavelength of about 1077 nm. The film may transmit, with high transmittance, light with a wavelength of about 1077 nm. Furthermore, this film may reflect, with high reflectance, light with a wavelength of about 1257.5 nm corresponding to first-Stokes light and light with a wavelength of about 1510.7 nm corresponding to second-Stokes light. A surface 65b of the input coupler mirror 65 on the side closer to the condenser lens 64 may be coated with a film. The film may transmit, with high transmittance, light with a wavelength of about 1077 nm.

The output coupler mirror 67 may be an optical device having a surface 67a on the side closer to the diamond crystal 66. The surface 67a may constitute a concave mirror. The output coupler mirror 67 may be an optical device in which the surface 67a, on the side closer to the diamond crystal 66, of a substrate is coated with a film. The substrate may transmit, with high transmittance, light with a wavelength of about 1077 nm and light with a wavelength of about 1510.7 nm. The film may reflect, with high reflectance, light with a wavelength of about 1077 nm and light with a wavelength of about 1257.5 nm corresponding to the first-Stokes light. Furthermore, this film may partially reflect light with a wavelength of about 1510.7 nm corresponding to the second-Stokes light with reflectance of about 16% and may slightly reflect light with a wavelength of about 1891.6 nm corresponding to third-Stokes light with reflectance of about 6%. The output coupler mirror 67 may have a surface 67b on the side closer to the high-reflection mirror 35. The surface 67b may be coated with a film. The film may transmit, with high transmittance, light with a wavelength of about 1077 nm and light with a wavelength of about 1510.7 nm.

The diamond crystal 66 may receive light with a wavelength of about 1077 nm and output Stokes light. The wavelengths of the first-Stokes light, the second-Stokes light, and the third-Stokes light are about 1257.5 nm, 1510.7 nm, and 1891.6 nm, respectively. The diamond crystal 66 may be disposed in an optical path within the optical resonator constituted by the input coupler mirror 65 and the output coupler mirror 67. A crystallographic axis <110> of the diamond crystal 66 may be substantially parallel to the optical path in the optical resonator. The diamond crystal 66 may have a thickness T of about 2 mm in a direction intersecting the optical path. The cross-sectional shape of the diamond crystal 66 along a plane intersecting the optical path may be a square. The thickness T may be the length of one side of this square. The diamond crystal 66 may have a length L of about 8 mm in the direction of the optical path.

As illustrated in FIG. 2, the high-reflection mirror 35 may be disposed to reflect, with high reflectance, the pulsed laser light LS with the fourth wavelength outputted from the diamond Raman laser unit 32 to cause the pulsed laser light LS to enter the dichroic mirror 36.

The dichroic mirror 36 may be an optical device in which a substrate that transmits, with high transmittance, the pulsed laser light LH with the third wavelength is coated with a film. The film may transmit, with high transmittance, the pulsed laser light LH with the third wavelength and reflect, with high reflectance, the pulsed laser light LS with the fourth wavelength. The dichroic mirror 36 may be disposed to cause the pulsed laser light LH and the pulsed laser light LS to enter the wavelength conversion system 37 in a state in which the optical path axes of the pulsed laser light LH and the pulsed laser light LS substantially coincide with each other.

The wavelength conversion system 37 may include dichroic mirrors 38 and 39. The dichroic mirror 38 may be an optical device coated with a film. The film may transmit, with high transmittance, the pulsed laser light with a wavelength of about 1510.7 nm and pulsed laser light with a wavelength of about 221.8 nm and reflect, with high reflectance, the pulsed laser light with a wavelength of about 260 nm. The dichroic mirror 39 may be an optical device coated with a film. The film may transmit, with high transmittance, the pulsed laser light with a wavelength of about 1510.7 nm and the pulsed laser light with a wavelength of about 221.8 nm and reflect, with high reflectance, pulsed laser light with a wavelength of about 193.4 nm.

Here, the Yb:solid-state amplifier 11 may correspond to a specific example of a "first solid-state amplifier" in a first solid-state laser system and a first excimer laser system according to some embodiments of the present disclosure. The LBO crystal 12 and the CLBO crystal 13 may correspond to specific examples of a "wavelength converter" according to some embodiments of the present disclosure. The Yb:solid-state amplifier 31 may correspond to a specific example of a "second solid-state amplifier" according to some embodiments of the present disclosure. The diamond Raman laser unit 32 may correspond to a specific example of a "Raman laser unit" according to some embodiments of the present disclosure.

The semiconductor laser 20 may correspond to a specific example of a "first oscillator" according to some embodiments of the present disclosure. The semiconductor optical amplifier 21 may correspond to a specific example of a "first laser light generator" according to some embodiments of the present disclosure. The Yb-fiber amplifier system 22 may correspond to a specific example of a "first fiber amplifier system" according to some embodiments of the present disclosure. The semiconductor laser 40 may correspond to a specific example of a "second oscillator" according to some embodiments of the present disclosure. The semiconductor optical amplifier 41 may correspond to a specific example of a "second laser light generator" according to some embodiments of the present disclosure. The Yb-fiber amplifier system 42 may correspond to a specific example of a "second fiber amplifier system" according to some embodiments of the present disclosure.

3.2 Operation

In the solid-state laser unit 30, the semiconductor laser 20 may output, as the seed light S1, CW oscillation light or pulsed oscillation light with a wavelength of about 1040 nm. This seed light S1 may be amplified and converted into pulsed laser light having a predetermined pulse width by the semiconductor optical amplifier 21. The pulsed laser light outputted from the semiconductor optical amplifier 21 may be amplified by the Yb-fiber amplifier system 22 with stimulated Brillouin scattering being suppressed. Thus, the solid-state laser unit 30 may output the pulsed laser light L1 with a wavelength of about 1040 nm. The pulsed laser light L1 outputted from the solid-state laser unit 30 may be amplified by the Yb:solid-state amplifier 11. Then, the pulsed laser light LH with a wavelength of about 260 nm, which is fourth-harmonic light of the pulsed laser light amplified by the Yb:solid-state amplifier 11, may be generated and outputted through the LBO crystal 12 and the CLBO crystal 13.

In addition, in the solid-state laser unit 30, the semiconductor laser 40 may output, as the seed light S2, CW oscillation light or pulsed oscillation light with a wavelength of about 1077 nm. This seed light S2 may be amplified and converted into pulsed laser light having a predetermined pulse width by the semiconductor optical amplifier 41. The pulsed laser light outputted from the semiconductor optical amplifier 41 may enter the Yb-fiber amplifier system 42.

The pulsed laser light that has entered the Yb-fiber amplifier system 42 may enter the Yb-fiber amplifier 53 via the WDM optical coupler 52 and be amplified by the Yb-fiber amplifier 53. The pulsed laser light amplified by the Yb-fiber amplifier 53 may enter the Yb-fiber amplifier 58 via the isolator 54, the band-pass filter 55, and the pump combiner 57. The isolator 54 may suppress the spontaneous emission light or the returning light from the Yb-fiber amplifiers 58 and 61. The band-pass filter 55 may suppress the passage of the spontaneous emission light from the Yb-fiber amplifiers 53 and 58 and suppress self-excited oscillation. The pulsed laser light that has entered the Yb-fiber amplifier 58 may be amplified by the Yb-fiber amplifier 58. The pulsed laser light amplified by the Yb-fiber amplifier 58 may enter the Yb-fiber amplifier 61 via the band-pass filter 59 and the isolator 60. The band-pass filter 59 may suppress the passage of the spontaneous emission light from the Yb-fiber amplifiers 58 and 61 and suppress self-excited oscillation. The isolator 60 may suppress the spontaneous emission light or the returning light from the Yb-fiber amplifier 61. The pulsed laser light that has entered the Yb-fiber amplifier 61 may be amplified by the Yb-fiber amplifier 61 with stimulated Brillouin scattering being suppressed. Thus, the solid-state laser unit 30 may output the pulsed laser light L2 with a wavelength of about 1077 nm.

The pulsed laser light L2 outputted from the solid-state laser unit 30 may be amplified by the Yb:solid-state amplifier 31. The pulsed laser light amplified by the Yb:solid-state amplifier 31 may enter the diamond Raman laser unit 32.

The pulsed laser light that has entered the diamond Raman laser unit 32 may be condensed by the condenser lens 64, be transmitted through the input coupler mirror 65 with high transmittance, and enter the diamond crystal 66. Stokes light may be generated in the diamond crystal 66.

The photon energy Es2 of second-Stokes light of the Stokes light generated in the diamond crystal 66 may be expressed through the following expression:

$$Es2 = E2 - 2 \cdot \Delta E \quad (1)$$

where E2 may be the photon energy of light entering the diamond crystal 66, and ΔE may be the energy of a diamond Raman shift. The energy ΔE of this diamond Raman shift may be 0.16527 [eV]. The photon energy E2 may be expressed through the following expression:

$$E2 = hv = hc/\lambda = 1240/\lambda \text{ [eV]} \quad (2)$$

where h may be the Planck constant, v may be the number of oscillations of the light entering the diamond crystal 66, λ may be the wavelength of the light entering the diamond crystal 66, and c may be the speed of light.

In a case where the pulsed laser light with a wavelength of about 1077 nm enters the diamond crystal 66, the photon energy E2 of that pulsed laser light may be 1.1513 [eV] (=1240/1077) from the expression (2). Thus, the photon energy Es2 of the second-Stokes light may be 0.8208 [eV] (=1.1513−2*0.16527) from the expression (1). The wavelength λs2 of this second-Stokes light may be 1510.7 [nm] (=1240/0.8208).

This second-Stokes light may be amplified and oscillated by the optical resonator constituted by the input coupler mirror 65 and the output coupler mirror 67. Consequently, the diamond Raman laser unit 32 may output the pulsed laser light LS with a wavelength of about 1510.7 nm.

The pulsed laser light LH with a wavelength of about 260 nm outputted from the CLBO crystal 13 may enter the wavelength conversion system 37 via, the dichroic mirror 36. In addition, the pulsed laser light LS with a wavelength of about 1510.7 nm outputted from the diamond Raman laser unit 32 may enter the wavelength conversion system 37 via the high-reflection mirror 35 and the dichroic mirror 36.

In the wavelength conversion system 37, the pulsed laser light with a wavelength of about 221.8 nm corresponding to the sum frequency of the wavelength of about 260 nm and the wavelength of about 1510.7 nm may be generated in a CLBO crystal 18. Three types of pulsed laser light, namely, the pulsed laser light with a wavelength of about 260 nm, the pulsed laser light with a wavelength of about 1510.7 nm, and the pulsed laser light with a wavelength of about 221.8 nm may be outputted from the CLBO crystal 18.

Of the three types of pulsed laser light outputted from the CLBO crystal 18, two types of pulsed laser light, namely, the pulsed laser light with a wavelength of about 1510.7 nm and the pulsed laser light with a wavelength of about 221.8 nm may be transmitted through the dichroic mirror 38 with high transmittance, and the pulsed laser light with a wavelength of about 260 nm may be reflected by the dichroic mirror 38 with high reflectance. The two types of pulsed laser light transmitted through the dichroic mirror 38 may enter a CLBO crystal 19.

In the CLBO crystal 19, the pulsed laser light LL with a wavelength of about 193.4 nm corresponding to the sum frequency of the wavelength of about 221.8 nm and the wavelength of about 1510.7 nm may be generated. Three types of pulsed laser light, namely, the pulsed laser light with a wavelength of about 1510.7 nm, the pulsed laser light with a wavelength of about 221.8 nm, and the pulsed laser light with a wavelength of about 193.4 nm may be outputted from the CLBO crystal 19.

Of the three types of pulsed laser light outputted from the CLBO crystal 19, the pulsed laser light with a wavelength of about 1510.7 nm and the pulsed laser light with a wavelength of about 221.8 nm may be transmitted through the dichroic mirror 39 with high transmittance, and the pulsed laser light with a wavelength of about 193.4 nm may be reflected by the dichroic mirror 39 with high reflectance. The pulsed laser light with a wavelength of about 193.4 nm may be reflected by a high-reflection mirror 97 with high reflectance and outputted from the wavelength conversion system 37 as the pulsed laser light LL.

3.3 Effect

According to the solid-state laser system of the present embodiment, the pulsed laser light with a wavelength of about 1040 nm outputted from the semiconductor optical amplifier 21 may be amplified by the Yb-fiber amplifier system 22 with stimulated Brillouin scattering being suppressed.

In addition, the pulsed laser light with a wavelength of about 1077 nm outputted from the semiconductor optical amplifier 41 may be amplified by the Yb-fiber amplifier system 42 and the Yb:solid-state amplifier 31 with stimulated Brillouin scattering being suppressed. The amplified pulsed laser light may be caused to enter the diamond Raman laser unit 32, and thus the pulsed laser light LS with a wavelength of about 1510.7 nm having a high pulse energy may be generated.

Furthermore, the pulsed laser light LH with a wavelength of about 260 nm and the pulsed laser light LS with a wavelength of about 1510.7 nm may be caused to enter the wavelength conversion system 37, and thus the pulsed laser light LL with a wavelength of about 193.4 nm having a high pulse energy may be generated and outputted.

3.4 Modification Examples

3.4.1 First Modification Example

In the solid-state laser system 10, the semiconductor laser 20 may output the seed light S1 with a wavelength of about 1040 nm, and the semiconductor laser 40 may output the seed light S2 with a wavelength of about 1077 nm. This, however, is not a limiting example. The wavelength of the pulsed laser light LL that the amplifier 2 can amplify may be in a range from 193 nm to 194 nm. Thus, the wavelengths of the seed light S1 and the seed light S2 may be set to such wavelengths that allow the pulsed laser light LL to have a wavelength in the stated range. Specifically, as indicated in FIG. 5, the wavelength of the seed light S1 may be in a range from 1032 nm to 1045 nm. In addition, the wavelength of the seed light S2 may be in a range from 1070 nm to 1093 nm.

For example, in a case where the wavelength of the seed light S1 is 1040 nm, the wavelength of the seed light S2 may be in a range from 1070 tint to 1088 nm, as indicated in Examples 1 to 3. In a case where the wavelength of the seed light S1 is 1037 nm, the wavelength of the seed light S2 may be in a range from 1077 nm to 1093 nm, as indicated in Examples 4, 6, and 7. In addition, for example, in a case where the wavelength of the seed light S2 is 1077 nm, the wavelength of the seed light S1 may be in a range from 1037 nm to 1045 nm, as indicated in Examples 1, 4, and 5. In a case where the wavelength of the seed light S2 is 1088 nm, the wavelength of the seed light S1 may be in a range from 1032 nm to 1040 nm, as indicated in Examples 2 and 8.

3.4.2 Second Modification Example

The Yb:solid-state amplifiers 11 and 31 may take a variety of configurations. Hereinafter, the Yb:solid-state amplifier 31 will be described with several illustrative examples. Similar examples apply to the Yb:solid-state amplifier 11 as well.

Figure 6:
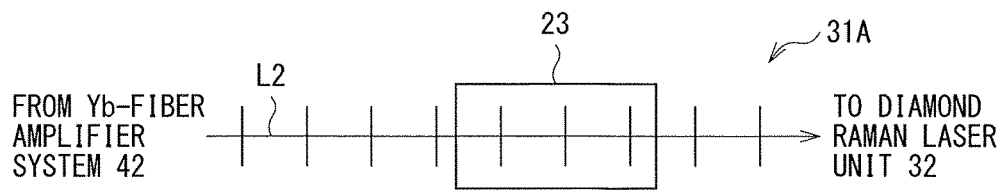
FIG. 6 is a configuration diagram illustrating a configuration example of a Yb:solid-state amplifier according to a second modification example of the first embodiment.

FIG. 6 schematically illustrates a configuration example of a Yb:solid-state amplifier 31A according to the present modification example. In FIG. 6, the lines intersecting the optical path of the pulsed laser light may indicate the polarization direction of the pulsed laser light. The Yb:solid-state amplifier 31A may include a solid-state amplifying member 23. The solid-state amplifying member 23 may be one of a Yb-doped rod-shaped crystal and a Yb-doped rod-shaped ceramic. The pulsed laser light L2 entering the Yb:solid-state amplifier 31A may be linearly polarized laser light. The Yb:solid-state amplifier 31A may further include a pumping semiconductor laser (not illustrated). In the Yb:solid-state amplifier 31A, the pulsed laser light L2 with a wavelength of about 1077 nm outputted from the Yb-fiber amplifier system 42 may pass through the solid-state amplifying member 23 once and thus be amplified.

Figure 7:
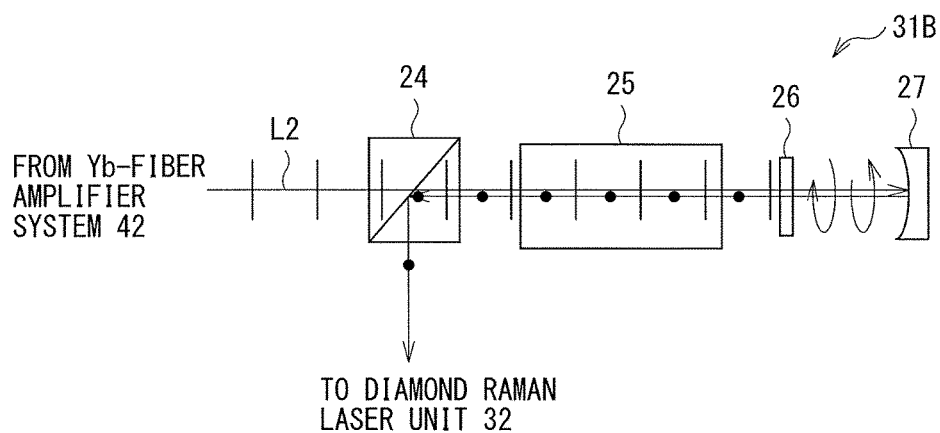
FIG. 7 is a configuration diagram illustrating a configuration example of another Yb:solid-state amplifier according to the second modification example of the first embodiment.

FIG. 7 schematically illustrates a configuration example of a Yb:solid-state amplifier 31B according to the present modification example. In FIG. 7, the lines intersecting the optical path of the pulsed laser light and the dots on the optical path may indicate the polarization directions of the pulsed laser light. The Yb:solid-state amplifier 31B may include a polarization beam splitter 24, a solid-state amplifying member quarter-wave plate 26, and a high-reflection mirror 27. The polarization beam splitter 24 may be disposed such that the linearly polarized pulsed laser light is incident thereon as P-polarized light. The solid-state amplifying member 25 may be disposed in an optical path of the pulsed laser light transmitted through the polarization beam splitter 24. The quarter-wave plate 26 may be disposed in an optical path of the pulsed laser light that has passed through the solid-state amplifying member 25. The high-reflection mirror 27 may be disposed to reflect, with high reflectance, the pulsed laser light that has passed through the quarter-wave plate 26 and to direct the reflected pulsed laser light back to the optical path of the incoming light. The high-reflection mirror 27 may be a concave mirror so that the thermal lens effect caused by the solid-state amplifying member 25 can be corrected. This, however, is not a limiting example, and a combination of a convex lens and a flat mirror may be used in place of the high-reflection mirror 27.

In the Yb:solid-state amplifier 31B, the pulsed laser light L2 with a wavelength of about 1077 nm outputted from the Yb-fiber amplifier system 42 may be incident on the polarization beam splitter 24 as P-polarized light and transmitted therethrough with high transmittance. The pulsed laser light transmitted through the polarization beam splitter 24 with high transmittance may pass through and be amplified in the solid-state amplifying member 25. The pulsed laser light amplified by the solid-state amplifying member 25 may pass through the quarter-wave plate 26, be reflected by the high-reflection mirror 27 with high reflectance, pass through the quarter-wave plate 26, and again pass through and be amplified in the solid-state amplifying member 25. At that time, the polarization plane of the pulsed laser light passing through the solid-state amplifying member 25 the second time may be substantially orthogonal to the polarization plane of the pulsed laser light passing through the solid-state amplifying member 25 the first time. The pulsed laser light amplified by the solid-state amplifying member 25 may be incident on the polarization beam splitter 24 as S-polarized light and be reflected thereby with high reflectance. In this manner, in the Yb:solid-state amplifier 31B, the pulsed laser light L2 may pass through the solid-state amplifying member 25 twice and be amplified therein.

In addition, by disposing such a Yb:solid-state amplifier 31B in two or more stages, the pulsed laser light may be allowed to pass through the solid-state amplifying member four or more times.

Figure 8:
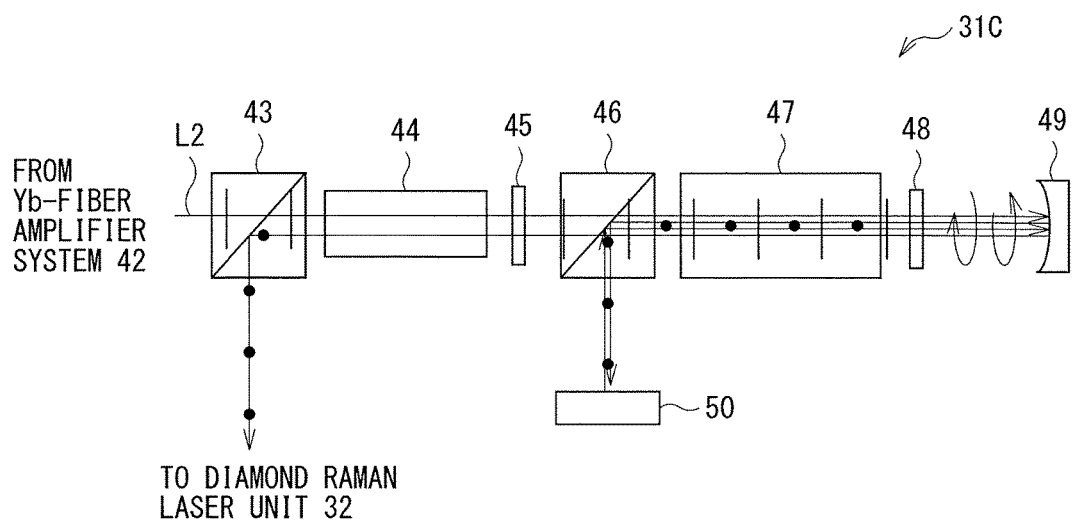
FIG. 8 is a configuration diagram illustrating a configuration example of yet another Yb:solid-state amplifier according to the second modification example of the first embodiment.

FIG. 8 schematically illustrates a configuration example of a Yb:solid-state amplifier 31C according to the present modification example. The Yb:solid-state amplifier 31C may include a polarization beam splitter 43, a Faraday rotator 44, a half-wave plate 45, a polarization beam splitter 46, a solid-state amplifying member 47, a quarter-wave plate 48, and high-reflection mirrors 49 and 50. The polarization beam splitter 43 may be disposed such that the linearly polarized pulsed laser light is incident thereon as P-polarized light. The Faraday rotator 44 may be disposed in an optical path of the pulsed laser light transmitted through the polarization beam splitter 43. The Faraday rotator 44 may rotate the polarization plane of the pulsed laser light by about 45 degrees. The half-wave plate 45 may be disposed downstream of the Faraday rotator 44 and disposed to rotate the polarization plane of the pulsed laser light by about 45 degrees in a direction opposite to the direction in which the polarization plane is rotated by the Faraday rotator 44. The polarization beam splitter 46 may be disposed downstream of the half-wave plate 45 and disposed such that the linearly polarized pulsed laser light is incident thereon as P-polarized The high-reflection mirror 50 may be a flat mirror and may be disposed to reflect, with high reflectance, the pulsed laser light reflected by the polarization beam splitter 46 with high reflectance and direct the reflected pulsed laser light back to the optical path of the incoming light. The solid-state amplifying member 47 may be disposed in an optical path of the pulsed laser light transmitted through the polarization beam splitter 46. The quarter-wave plate 48 may be disposed in an optical path of the pulsed laser light that has passed through the solid-state amplifying member 47. The high-reflection mirror 49 may be a concave mirror and may be disposed to reflect, with high reflectance, the pulsed laser light that has passed through the quarter-wave plate 48 and to direct the reflected pulsed laser light back to the optical path of the incoming light.

In the Yb:solid-state amplifier 31C, the pulsed laser light L2 with a wavelength of about 1077 nm outputted from the Yb-fiber amplifier system 42 may be incident on the polarization beam splitter 43 as P-polarized light and be transmitted therethrough with high transmittance. The pulsed laser light transmitted through the polarization beam splitter 43 with high transmittance may enter the Faraday rotator 44 as light traveling in the same direction as the direction of the magnetic field within the Faraday rotator 44 and have the polarization plane thereof rotated by about 45 degrees. The pulsed laser light outputted from the Faraday rotator 44 may be incident on the half-wave plate 45 and have the polarization plane thereof rotated by about 45 degrees in the direction opposite to the direction in which the polarization plane has been rotated by the Faraday rotator 44. Thus, the resulting angle of rotation of the polarization plane of the pulsed laser light rotated by the Faraday rotator 44 and the half-wave plate 45 may be about 0 degrees. To rephrase, the polarization plane of the pulsed laser light that has passed through the half-wave plate 45 may substantially coincide with the polarization plane of the pulsed laser light entering the Faraday rotator 44.

The pulsed laser light that has passed through the half-wave plate 45 may be incident on the polarization beam splitter 46 as P-polarized light and be transmitted therethrough with high transmittance. The pulsed laser light transmitted through the polarization beam splitter 46 with high transmittance may pass through and be amplified in the solid-state amplifying member 47. The pulsed laser light amplified by the solid-state amplifying member 47 may pass through the quarter-wave plate 48, be reflected by the high-reflection mirror 49 with high reflectance, pass through the quarter-wave plate 48, and again pass through and be amplified in the solid-state amplifying member 47. At that time, the polarization plane of the pulsed laser light passing through the solid-state amplifying member 47 the second time may be substantially orthogonal to the polarization plane of the pulsed laser light passing through the solid-state amplifying member 47 the first time. The pulsed laser light amplified twice by the solid-state amplifying member 47 may be incident on the polarization beam splitter 46 as S-polarized light and be reflected thereby with high reflectance. The pulsed laser light reflected by the polarization beam splitter 46 with high reflectance may be reflected by the high-reflection mirror 50 with high reflectance, be incident on the polarization beam splitter 46 as S-polarized light, and be reflected thereby with high reflectance. The pulsed laser light reflected by the polarization beam splitter 46 with high reflectance may again pass through and be amplified in the solid-state amplifying member 47. The pulsed laser light amplified by the solid-state amplifying member 47 may pass through the quarter-wave plate 48, be reflected by the high-reflection mirror 49 with high reflectance, pass through the quarter-wave plate 48, and again pass through and be amplified in the solid-state amplifying member 47. At that time, the polarization plane of the pulsed laser light passing through the solid-state amplifying member 47 the fourth time may substantially coincide with the polarization plane of the pulsed laser light passing through the solid-state amplifying member 47 the first time.

The pulsed laser light amplified four times by the solid-state amplifying member 47 may be incident on the polarization beam splitter 46 as P-polarized light and be transmitted therethrough with high transmittance. The pulsed laser light transmitted through the polarization beam splitter 46 with high transmittance may be incident on the half-wave plate 45 and have the polarization plane thereof rotated by about 45 degrees. The pulsed laser light that has passed through the half-wave plate 45 may enter the Faraday rotator 44 as light traveling in the direction opposite to the direction of the magnetic field within the Faraday rotator 44, and have the polarization plane thereof rotated by about 45 degrees in the same direction as the direction in which the polarization plane has been rotated by the half-wave plate 45. Thus, the resulting angle of rotation of the polarization plane of the pulsed laser light rotated by the half-wave plate 45 and the Faraday rotator 44 may be about 90 degrees. To rephrase, the polarization plane of the pulsed laser light outputted from the Faraday rotator 44 may be substantially orthogonal to the polarization plane of the pulsed laser light incident on the half-wave plate 45. The pulsed laser light outputted from the Faraday rotator 44 may be incident on the polarization beam splitter 43 as S-polarized light and be reflected thereby with high reflectance. In this manner, in the Yb:solid-state amplifier 31C, the pulsed laser light L2 may pass through the solid-state amplifying member 47 four times and be amplified therein.

In the foregoing examples, the pulsed laser light may be allowed to pass through the solid-state amplifying member a plurality of times by controlling the polarization; however, this is not a limiting example. In addition, a rod-shaped solid-state amplifying member may be used in the foregoing examples; however, this is not a limiting example. Alternatively, for example, a slab-shaped solid-state amplifying member may be used, as illustrated hereinafter.

FIGS. 9A and 9B schematically illustrate a configuration example of a Yb:solid-state amplifier 31D according to the present modification example. FIG. 9A may be a plan view of the Yb:solid-state amplifier 31D, and FIG. 9B may be a side view of the Yb:solid-state amplifier 31D. The Yb:solid-state amplifier 31D may include a solid-state amplifying member 91 and high-reflection mirrors 92 and 93. The solid-state amplifying member 91 may be one of a Yb-doped slab-shaped crystal and a Yb-doped slab-shaped ceramic. The high-reflection mirrors 92 and 93 may be disposed to oppose each other with the solid-state amplifying member 91 interposed therebetween. In the Yb:solid-state amplifier 31D, the pulsed laser light L2 with a wavelength of about 1077 nm outputted from the Yb-fiber amplifier system 42 may be reflected by the high-reflection mirrors 92 and 93 with high reflectance, pass through the solid-state amplifying member 91 five times, and thus be amplified. The number of times the pulsed laser light passes through the solid-state amplifying member 91 is not limited to five and may be four or less or six or more. In the Yb:solid-state amplifier 31D, the pulsed laser light may pass through the solid-state amplifying member 91 a plurality of times in this manner. Thus, it is possible to increase the amplification efficiency.

3.4.3 Third Modification Example

The solid-state amplifying member in the Yb:solid-state amplifier 11 or 31 may be constituted by a variety of materials including Yb. Specifically, the material for the solid-state amplifying member may be the materials indicated in FIG. 10, for example. In FIG. 10, abbreviations are also indicated for some of the materials. Each of the materials belonging to a material group A may be a material that can amplify pulsed laser light with a wavelength of about 1040 nm and pulsed laser light with a wavelength of about 1077 nm. Each of the materials belonging to a material group B may be a material that can amplify pulsed laser light with a wavelength of about 1040 nm. Each of the materials belonging to the material group B may be a material that may be less likely to amplify pulsed laser light with a wavelength of about 1077 nm.

The solid-state amplifying member in the Yb:solid-state amplifier 11 that amplifies the pulsed laser light with a wavelength of about 1040 nm may include one or more materials belonging to the material group A or may include one or more materials belonging to the material group B. The solid-state amplifying member in the Yb:solid-state amplifier 31 that amplifies the pulsed laser light with a wavelength of about 1077 nm may include one or more materials belonging to the material group A. The material for the solid-state amplifying member in the Yb:solid-state amplifier 11 may be the same as the material for the solid-state amplifying member in the Yb:solid-state amplifier 31.

3.4.4 Fourth Modification Example

The diamond crystal 66 may have a thickness T of about 2 mm and a length L of about 8 mm; however, this is not a limiting example. By increasing the beam diameter of the pulsed laser light with a wavelength of about 1077 nm entering the diamond crystal 66, the energy of the second-Stokes light outputted from the diamond crystal 66 may be increased. Thus, as the diamond crystal 66 is thicker, the energy of the second-Stokes light may be higher. In addition, as the diamond crystal 66 is longer, the energy of the second-Stokes light may be higher since a larger Raman gain can be obtained.

With regard to a monocrystal diamond crystal with low birefringence and low scattering that may be used as a medium for the diamond Raman laser unit 32, for example, a crystal with a thickness T of about 2 mm and a length L of about 8 mm may be available from "Element Six" located in London, England.

For example, when the peak power density of the pulsed laser light with a wavelength of about 1077 nm serving as pumping laser light is about 217 MW/cm², the power conversion efficiency from the pumping laser light to the second-Stokes light in the diamond Raman laser unit may be no lower than 50%. Here, the peak power density may be the power per unit area and per unit time and may be expressed through the following expression:

$$P_d = P/(f \cdot S \cdot \tau) \quad (3)$$

where, P may be the optical power, and f may be the repetition frequency. S may be the cross-sectional area of the beam, and τ may be the pulse width. Thus, in a case where the second-Stokes light having the power P of 2 W and the repetition frequency f of 6 kHz is to be obtained with the use of the pumping laser light having the power P of 4 W and the peak power density $P_d$ of about 217 MW/cm², the beam diameter of the pumping laser light at the crystal center of the diamond crystal may be about 200 μm. From the Gaussian beam propagation equation, the radius w of the beam at a position away from the crystal center by a distance z may be expressed by the following expression:

$$w = w_0 \{1 + (z/z_R)^2\}^{1/2} \quad (4)$$

$$z_R = \pi w_0^2 \lambda \quad (5)$$

where, $w_0$ may be the spot size at a portion at which the beam is condensed to its narrowest size. This spot size may be the radius of the Gaussian beam. Thus, in a case where a diamond crystal having a length L of about 8 mm is used, the diameter of the beam on the incident surface of the diamond crystal that is away from the crystal center of the diamond crystal by 4 mm may be about 204 μm. In order to suppress a diffraction effect, the thickness T of the diamond crystal may be set to about twice the diameter of the beam. Therefore, the thickness T of the diamond crystal may be no less than about 0.41 mm. On the basis of the above, in a case where the length L of the diamond crystal 66 is about 8 mm, the thickness T may be in a range from 0.41 mm to 2 mm.

3.4.5 Fifth Modification Example

The amplifier 2 may take a variety of configurations. Hereinafter, the present modification example will be described with several illustrative examples.

Figure 11:
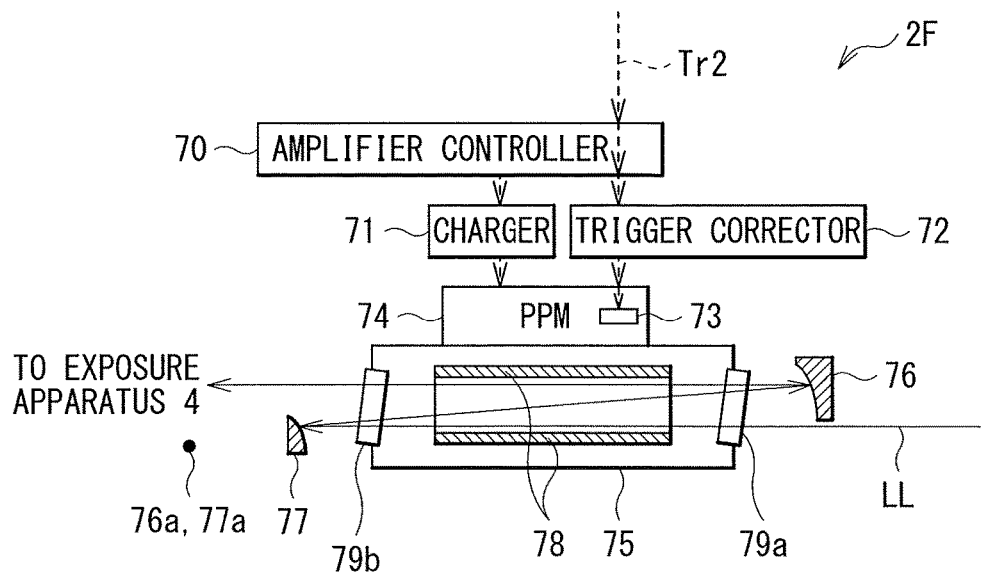
FIG. 11 is a configuration diagram schematically illustrating a configuration example of an amplifier according to a fifth modification example of the first embodiment.

FIG. 11 schematically illustrates a configuration example of an amplifier 2F according to the present modification example. The amplifier 2F may include an amplifier controller 70, a charger 71, a trigger corrector 72, a pulse power module (PPM) 74, a chamber 75, a concave mirror 76, and a convex mirror 77. The pulse power module 74 may include a switch 73. The chamber 75 may be provided with windows 79a and 79b. A laser gas including, for example, an Ar gas, a $F_2$ gas, and a Ne gas may be present inside the chamber 75. A pair of discharge electrodes 78 may be disposed in the chamber 75. The pair of discharge electrodes 78 may be coupled to an output terminal of the pulse power module 74. The concave mirror 76 and the convex mirror 77 may be configured such that a focal point position 76a of the concave mirror 76 and a focal point position 77a of the convex mirror 77 substantially coincide with each other.

The amplifier 2F may cause a discharge across the pair of discharge electrodes 78 in synchronization with the entry of the pulsed laser light LL to produce inverted population.

Here, the trigger corrector 72 may adjust the timing of the switch 73 in the pulse power module 74 so that the pulsed laser light LL with a wavelength of about 193.4 nm from the solid-state laser system 10 is amplified with high efficiency in the amplifier 2F. In the amplifier 2F, the pulsed laser light LL may be reflected by the convex mirror 77 and the concave mirror 76 and may thus pass through the discharge space between the pair of discharge electrodes 78 three times. Thus, the pulsed laser light LL may have the beam thereof enlarged and be amplified. In this manner, the pulsed laser light LL with a wavelength of about 193.4 nm outputted from the solid-state laser system 10 may be amplified by the amplifier 2F and outputted toward the exposure apparatus 4.

Figure 12:
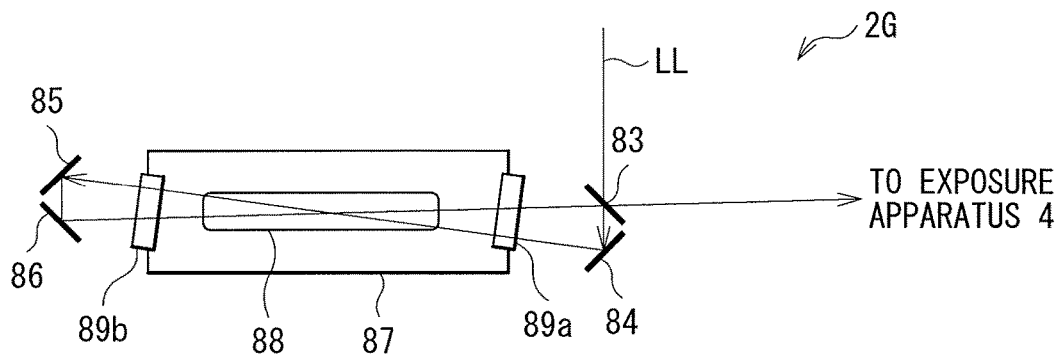
FIG. 12 is a configuration diagram schematically illustrating a configuration example of another amplifier according to the fifth modification example of the first embodiment.

FIG. 12 schematically illustrates a configuration example of an amplifier 2G according to the present modification example. The amplifier 2G may include a chamber 87, an output coupler mirror 83, and high-reflection mirrors 84 to 86. Similarly to the amplifier 2F illustrated in FIG. 11, the amplifier 2G may further include an amplifier controller 70, a charger 71, a trigger corrector 72, and a pulse power module 74 that includes a switch 73, which are not illustrated in FIG. 12. Furthermore, the amplifier 2G may include a high-reflection mirror that guides the pulsed laser light LL from the solid-state laser system to the amplifier 2G and another high-reflection mirror that guides the pulsed laser light outputted from the amplifier 2G to the exposure apparatus 4.

The chamber 87 may be provided with windows 89a and 89b. A pair of discharge electrodes 88 may be disposed in the chamber 87. The pair of discharge electrodes 88 may be disposed to oppose each other in the depthwise direction in FIG. 12. The output coupler mirror 83 and the high-reflection mirrors 84 to 86 may constitute an optical resonator. In the amplifier 2G, the pulsed laser light travels repeatedly and sequentially via the output coupler mirror 83, the high-reflection mirror 84, the discharge space between the pair of discharge electrodes 88, the high-reflection mirror 85, the high-reflection mirror 86, and the discharge space between the pair of discharge electrodes 88 and be amplified.

4. Second Embodiment

Now, a solid-state laser system according to a second embodiment of the present disclosure will be described. A solid-state laser system 110 may have a configuration in which pulsed laser light with a wavelength of about 1040 nm outputted from a semiconductor optical amplifier 21 and pulsed laser light with a wavelength of about 1077 nm outputted from a semiconductor optical amplifier 41 are amplified by a single Yb-fiber amplifier system. In the following, constituent elements that are substantially the same as those of the solid-state laser system 10 according to the first embodiment described above are given identical reference characters, and descriptions thereof will be omitted as appropriate.

4.1 Configuration

Figure 13:
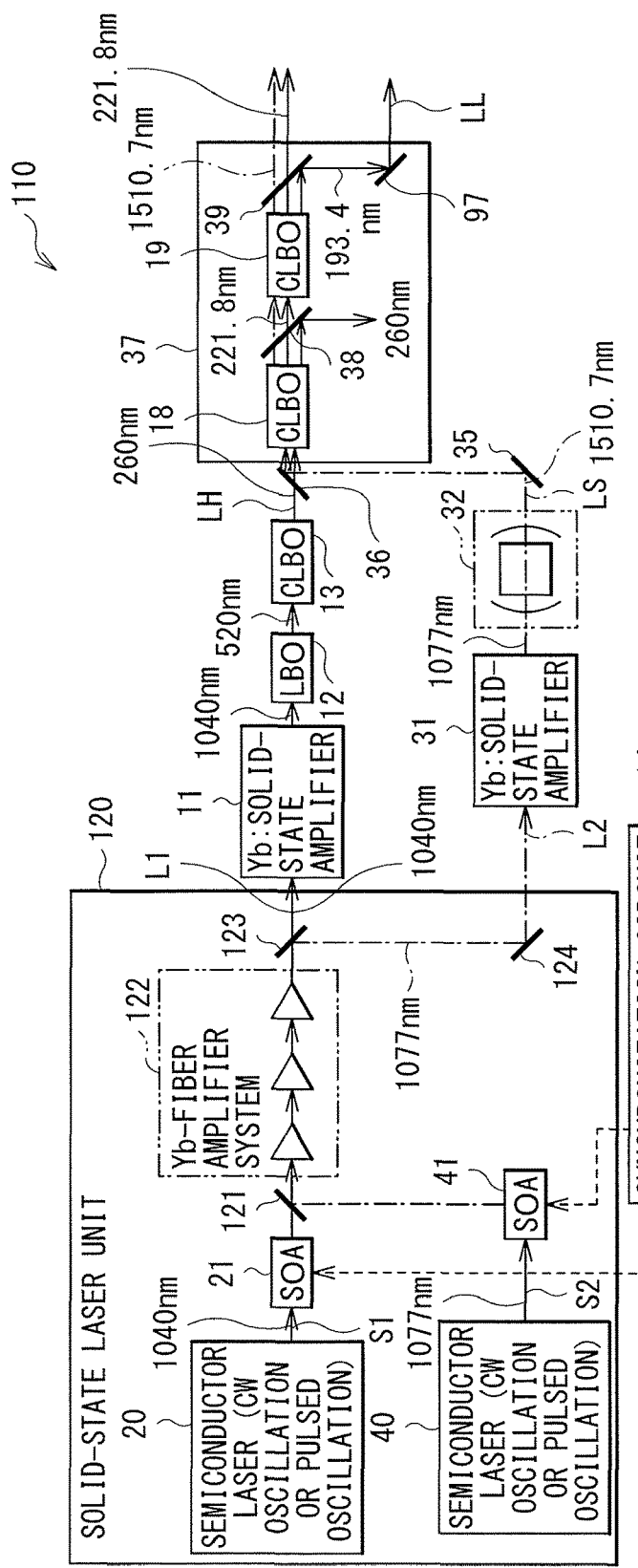
FIG. 13 is a configuration diagram schematically illustrating a configuration example of a solid-state laser system according to a second embodiment.

FIG. 13 schematically illustrates a configuration example of the solid-state laser system 110. The solid-state laser system 110 may include a solid-state laser unit 120. The solid-state laser unit 120 may include dichroic mirrors 121 and 123, a Yb-fiber amplifier system 122, and a high-reflection mirror 124.

The dichroic mirror 121 may be an optical device in which a substrate that transmits, with high transmittance, the pulsed laser light with a wavelength of about 1040 nm is coated with a film. The film may transmit, with high transmittance, the pulsed laser light with a wavelength of about 1040 nm and reflect, with high reflectance, the pulsed laser light with a wavelength of about 1077 nm. The dichroic mirror 121 may be disposed to cause the pulsed laser light outputted from the semiconductor optical amplifier 21 and the pulsed laser light outputted from the semiconductor optical amplifier 41 to enter the Yb-fiber amplifier system 122 in a state in which their optical path axes substantially coincide with each other.

The Yb-fiber amplifier system 122 may have a configuration similar to that of the Yb-fiber amplifier system 42 illustrated in FIG. 3. The Yb-fiber amplifier system 122 may have gains in both wavelength ranges of the wavelength of about 1040 nm and the wavelength of about 1077 nm.

The dichroic mirror 123 may be disposed in an optical path between the Yb-fiber amplifier system 122 and a Yb:solid-state amplifier 11. The dichroic mirror 123 may be an optical device in which a substrate that transmits, with high transmittance, the pulsed laser light with a wavelength of about 1040 nm is coated with a film. The film may transmit, with high transmittance, the pulsed laser light with a wavelength of about 1040 nm and reflect, with high reflectance, the pulsed laser light with a wavelength of about 1077 nm.

The high-reflection mirror 124 may be disposed to reflect, with high reflectance, the pulsed laser light with a wavelength of about 1077 nm reflected by the dichroic mirror 123 with high reflectance and to cause the pulsed laser light reflected with high reflectance to enter a Yb:solid-state amplifier 31.

Here, the Yb-fiber amplifier system 122 may correspond to a specific example of a "fiber amplifier system" in a first solid-state laser system and a first excimer laser system according to some embodiments of the present disclosure. The dichroic mirror 123 and the high-reflection mirror 124 may correspond to specific examples of an "optical device" according to some embodiments of the present disclosure.

4.2 Operation

The pulsed laser light with a wavelength of about 1040 nm outputted from the semiconductor optical amplifier 21 may be transmitted through the dichroic mirror 121 with high transmittance and enter the Yb-fiber amplifier system 122. The pulsed laser light with a wavelength of about 1077 nm outputted from the semiconductor optical amplifier 41 may be reflected by the dichroic mirror 121 with high reflectance and enter the Yb-fiber amplifier system 122. Two types of pulsed laser light, namely, the pulsed laser light with a wavelength of about 1040 nm and the pulsed laser light with a wavelength of about 1077 nm may be amplified by the Yb-fiber amplifier system 122. Of the two types of pulsed laser light outputted from the Yb-fiber amplifier system 122, the pulsed laser light with a wavelength of about 1040 nm may enter the Yb:solid-state amplifier 11 via the dichroic mirror 123. Meanwhile, of the two types of pulsed laser light outputted from the Yb-fiber amplifier system 122, the pulsed laser light with a wavelength of about 1077 nm may enter the Yb:solid-state amplifier 31 via the dichroic mirror 123 and the high-reflection mirror 124.

4.3 Effect

According to the solid-state laser system of the present embodiment, the pulsed laser light with a wavelength of about 1040 nm and the pulsed laser light with a wavelength of about 1077 nm may each be amplified by the single Yb-fiber amplifier system 122, and thus the configuration of the solid-state laser system may be made compact in size.

4.4 Modification Examples

4.4.1 First Modification Example

In the solid-state laser system 110, two types of pulsed laser light, namely, the pulsed laser light with a wavelength of about 1040 nm and the pulsed laser light with a wavelength of about 1077 nm may be coupled by the dichroic mirror 121; however, this is not a limiting example. Alternatively, for example, the two types of pulsed laser light may be coupled by a wavelength dispersion device, such as a prism, a grating, or an etalon. In addition, for example, two types of light may be coupled by a WDM optical coupler, as in solid-state laser systems 110A and 110B illustrated in FIGS. 14 and 15.

Figure 14:
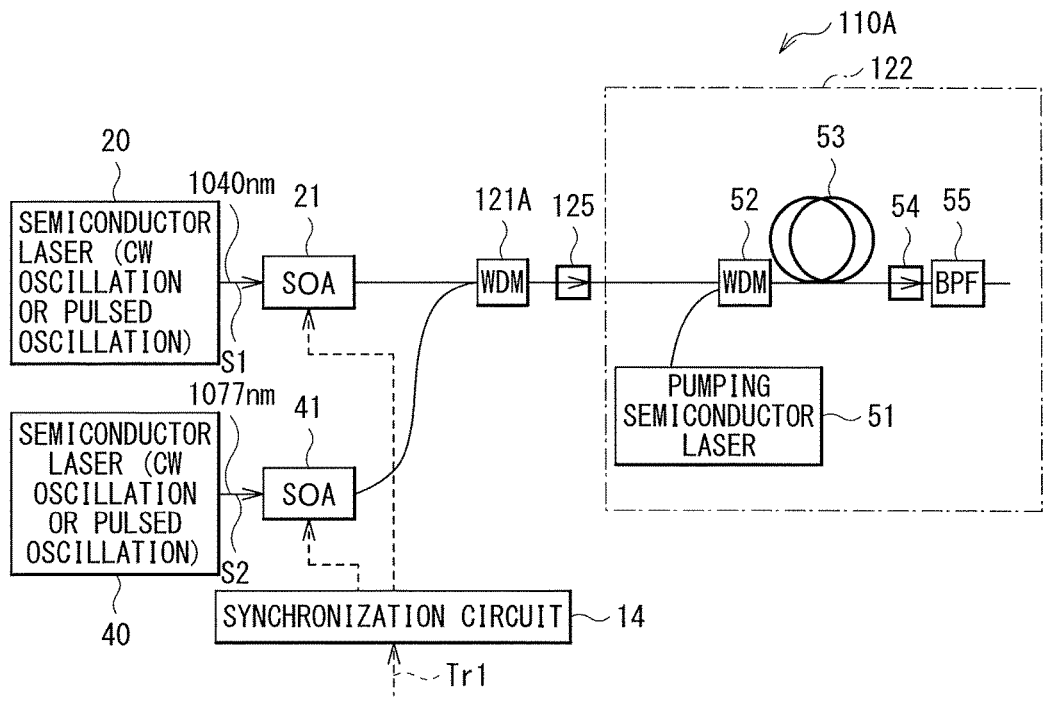
FIG. 14 is a configuration diagram illustrating a configuration example of a solid-state laser system according to a first modification example of the second embodiment.

FIG. 14 schematically illustrates a configuration example of the solid-state laser system 110A. FIG. 14 may illustrate optical paths from semiconductor lasers 20 and 40 to a Yb-fiber amplifier system 122. The solid-state laser system 110A may include a WDM optical coupler 121A and an isolator 125. The WDM optical coupler 121A may couple an optical fiber coupled to a semiconductor optical amplifier 21 and an optical fiber coupled to a semiconductor optical amplifier 41. The isolator 125 may be a Faraday isolator for suppression of the passage of returning light, for example. The isolator 125 is provided in this example; however, the isolator 125 may be omitted. Thus, the pulsed laser light with a wavelength of about 1040 nm outputted from the semiconductor optical amplifier 21 and the pulsed laser light with a wavelength of about 1077 nm outputted from the semiconductor optical amplifier 41 may be coupled by the WDM optical coupler 121A. Those two types of pulsed laser light may enter the Yb-fiber amplifier system 122 the isolator 125.

Figure 15:
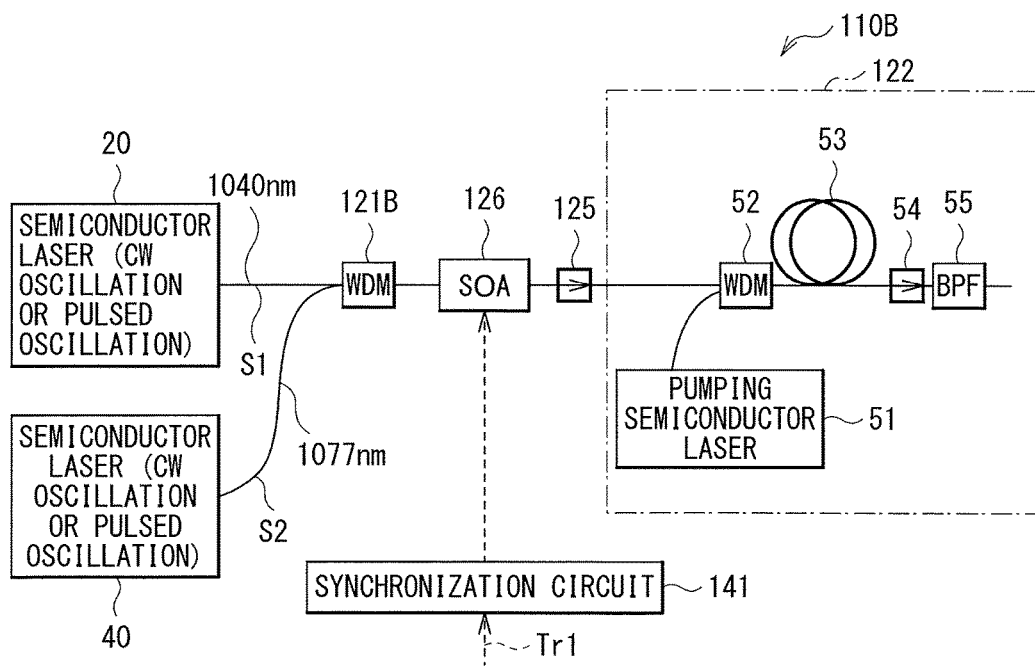
FIG. 15 is a configuration diagram illustrating a configuration example of another solid-state laser system according to the first modification example of the second embodiment.

FIG. 15 schematically illustrates a configuration example of the solid-state laser system 110B. The solid-state laser system 110B may include a WDM optical coupler 121B, a semiconductor optical amplifier 126, a synchronization circuit 141, and an isolator 125. The WDM optical coupler 121B may couple an optical fiber coupled to a semiconductor laser 20 and an optical fiber coupled to a semiconductor laser 40. The semiconductor optical amplifier 126 may be a semiconductor device that amplifies and converts seed light S1 and seed light S2 into pulsed laser light having a predetermined pulse width. The synchronization circuit 141 may be configured to output a predetermined trigger signal to the semiconductor optical amplifier 126 in accordance with a trigger signal Tr1. Thus, the seed light S1 with a wavelength of about 1040 nm outputted from the semiconductor laser 20 and the seed light S2 with a wavelength of about 1077 nm outputted from the semiconductor laser 40 may be coupled by the WDM optical coupler 121B. Then, the seed light S1 and the seed light S2 may be amplified and converted into pulsed laser light having a predetermined pulse width by the semiconductor optical amplifier 126 and enter a Yb-fiber amplifier system 122 via the isolator 125. In this case, in FIG. 13, an optical path length LEN1 in an optical path connecting the dichroic mirror 123, the Yb:solid-state amplifier 11, an LBO crystal 12, a CLBO crystal 13, and a dichroic mirror 36 may be substantially equal to an optical path length LEN2 in an optical path connecting the dichroic mirror 123, the high-reflection mirror 124, the Yb:solid-state amplifier 31, a diamond Raman laser unit 32, a high-reflection mirror 35, and the dichroic mirror 36. Thus, the pulsed laser light LH and the pulsed laser light LS may enter the wavelength conversion system 37 at substantially the same time.

4.4.2 Second Modification Example

In the solid-state laser system 110, two types of pulsed laser light, namely, the pulsed laser light with a wavelength of about 1040 nm and the pulsed laser light with a wavelength of about 1077 nm may be branched by the dichroic mirror 123; however, this is not a limiting example. Alternatively, for example, the two types of pulsed laser light may be branched by a wavelength dispersion device, such as a prism, a grating, or an etalon.

5. Third Embodiment

Now, a solid-state laser system according to a third embodiment of the present disclosure will be described. A solid-state laser system 130 may have a configuration in which pulsed laser light with a wavelength of about 1040 nm outputted from a semiconductor optical amplifier 21 and pulsed laser light with a wavelength of about 1077 nm outputted from a semiconductor optical amplifier 41 are amplified by a single Yb-fiber amplifier system and a single Yb:solid-state amplifier. In the following, constituent elements that are substantially the same as those of the solid-state laser system 110 according to the second embodiment described above are given identical reference characters, and descriptions thereof will be omitted as appropriate.

5.1 Configuration

Figure 16:
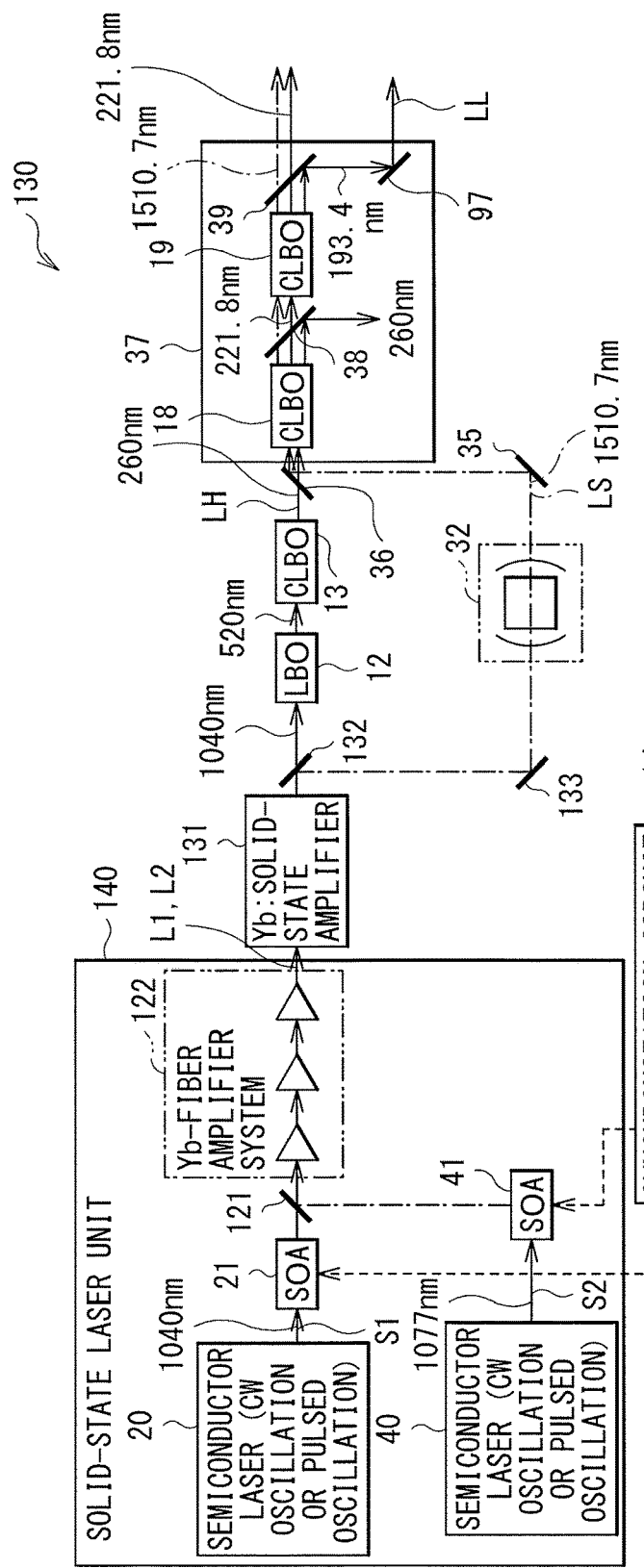
FIG. 16 is a configuration diagram schematically illustrating a configuration example of a solid-state laser system according to a third embodiment.

FIG. 16 schematically illustrates a configuration example of the solid-state laser system 130. The solid-state laser system 130 may include a solid-state laser unit 140, a Yb:solid-state amplifier 131, a dichroic mirror 132, and a high-reflection mirror 133.

The solid-state laser unit 140 may be a laser unit similar to the solid-state laser unit 120 according to the second embodiment excluding the dichroic mirror 123 and the high-reflection mirror 124.

The Yb:solid-state amplifier 131 may be disposed downstream of a Yb-fiber amplifier system 122. A solid-state amplifying member in the Yb:solid-state amplifier 131 may include one or more materials belonging to the material group A indicated in FIG. 10.

The dichroic mirror 132 may be disposed in an optical path between the Yb:solid-state amplifier 131 and an LBO crystal 12. The dichroic mirror 132 may be an optical device in which a substrate that transmits, with high transmittance, the pulsed laser light with a wavelength of about 1040 nm is coated with a film. The film may transmit, with high transmittance, the pulsed laser light with a wavelength of about 1040 nm and reflect, with high reflectance, the pulsed laser light with a wavelength of about 1077 nm.

The high-reflection mirror 133 may be disposed to reflect, with high reflectance, the pulsed laser light with a wavelength of about 1077 nm reflected by the dichroic mirror 132 with high reflectance and to cause the pulsed laser light reflected with high reflectance to enter a diamond Raman laser unit 32.

Here, the Yb:solid-state amplifier 131 may correspond to a specific example of a "solid-state amplifier" in a second solid-state laser system and a second excimer laser system according to some embodiments of the present disclosure. The dichroic mirror 132 and the high-reflection mirror 133 may correspond to specific examples of an "optical device" according to some embodiments of the present disclosure.

5.2 Operation

Two types of pulsed laser light, namely, the pulsed laser light with a wavelength of about 1040 nm and the pulsed laser light with a wavelength of about 1077 nm may be amplified by the Yb-fiber amplifier system 122 and amplified further by the Yb:solid-state amplifier 131. Of the two types of pulsed laser light outputted from the Yb:solid-state amplifier 131, the pulsed laser light with a wavelength of about 1040 nm may enter the LBO crystal 12 via the dichroic mirror 132. Meanwhile, of the two types of pulsed laser light outputted from the Yb:solid-state amplifier 131, the pulsed laser light with a wavelength of about 1077 nm may enter the diamond Raman laser unit 32 via the dichroic mirror 132 and the high-reflection mirror 133.

5.3 Effect

According to the solid-state laser system of the present embodiment, the pulsed laser light with a wavelength of about 1040 nm and the pulsed laser light with a wavelength of about 1077 nm may each be amplified by the single Yb:solid-state amplifier 131. Thus, the configuration of the solid-state laser system may be made compact in size,

6. Hardware Environment of Controller

A person skilled in the art will appreciate that the subject matter described herein may be implemented by a general-purpose computer or a programmable controller in combination with a program module or a software application. In general, a program module includes routines, programs, components, data structures, and so forth that can implement the processes described in some embodiments of the present disclosure.

Figure 17:
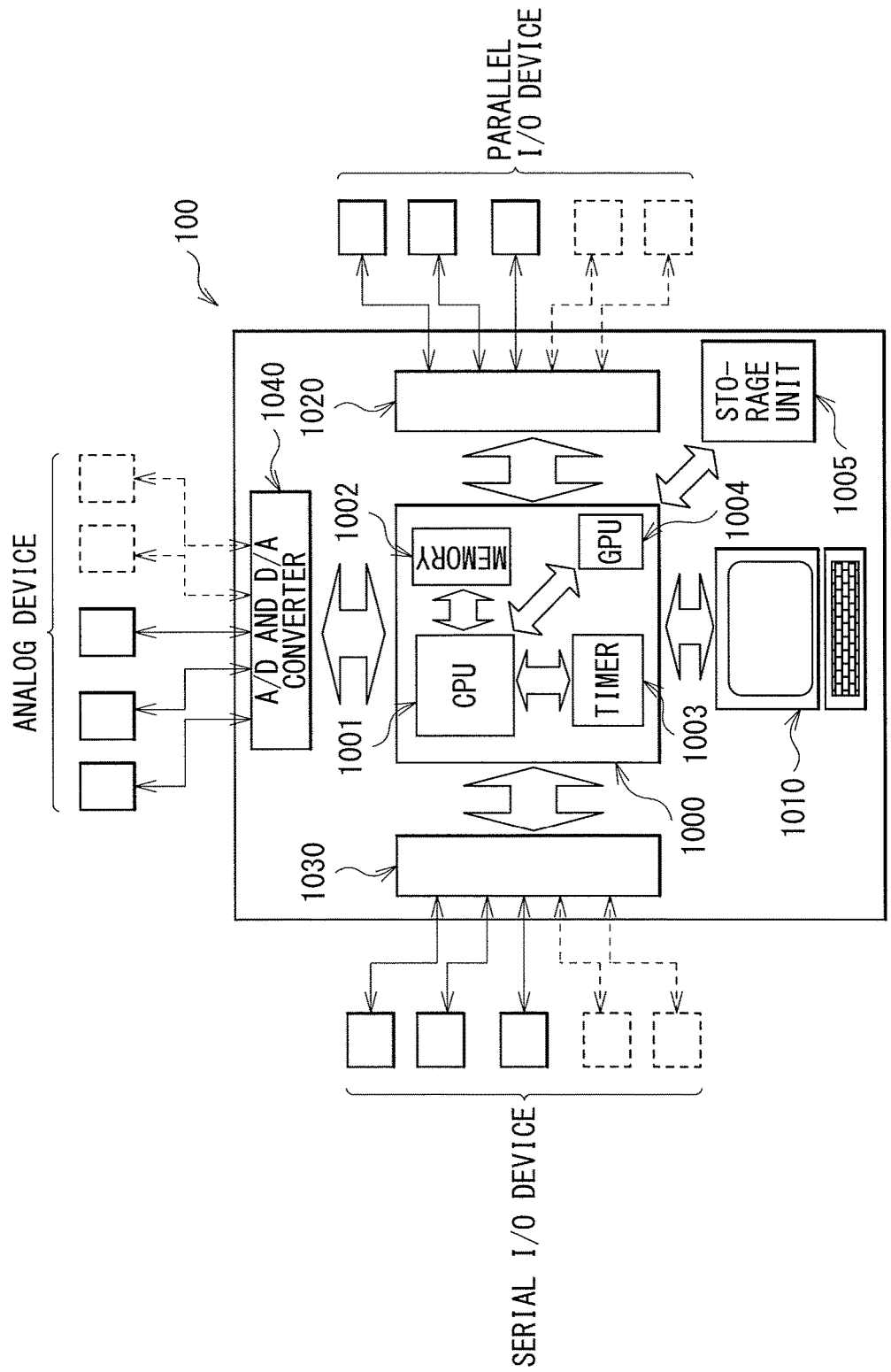
FIG. 17 is a configuration diagram illustrating an example of a hardware environment of a controller.

FIG. 17 is a block diagram illustrating an exemplary hardware environment in which various aspects of the disclosed subject matter may be implemented. An exemplary hardware environment 100 illustrated in FIG. 17 may include a processing unit 1000, a storage unit 1005, a user interface 1010, a parallel input/output (I/O) controller 1020, a serial I/O controller 1030, and an analog-to-digital (A/I)) and digital-to-analog (D/A) converter 1040. The configuration of the hardware environment 100, however, is not limited to the above.

The processing unit 1000 may include a central processing unit (CPU) 1001, a memory 1002, a timer 1003, and a graphics processing unit (GPU) 1004. The memory 1002 may include a random-access memory (RAM) and a read-only memory (ROM). The CPU 1001 may be any of commercially available processors. Dual microprocessors and other multi-processor architectures may also be employed as the CPU 1001.

These components illustrated in FIG. 17 may be interconnected to one another to implement the processes described in some embodiments of the present disclosure.

In operation, the processing unit 1000 may load programs stored in the storage unit 1005 and execute the programs. The processing unit 1000 may also read data from the storage unit 1005 along with the programs. In addition, the processing unit 1000 may write data into the storage unit 1005. The CPU 1001 may execute the programs loaded from the storage unit 1005. The memory 1002 may be a work area for temporal storing of the programs to be executed by the CPU 1001 and the data to be used in the operations of the CPU 1001. The timer 1003 may measure time intervals to provide the CPU 1001 with a measured result in accordance with the execution of the programs. The GPU 1004 may process image data and provide the CPU 1001 with a processing result in accordance with the programs loaded from the storage unit 1005.

The parallel I/O controller 1020 may be coupled to parallel I/O devices, such as the laser controller 3, the synchronization controller 6, the synchronization circuit 14, the amplifier controller 70, and the charger 71, that communicate with the processing unit 1000 and may control communication between the processing unit 1000 and these parallel I/O devices. The serial I/O controller 1030 may be coupled to a plurality of serial I/O devices, such as the laser controller 3, the exposure apparatus controller 5, the synchronization controller 6, and the synchronization circuit 14, that can communicate with the processing unit 1000 and may control communication between the processing unit 1000 and the plurality of serial I/O devices. The A/D and D/A converter 1040 may be coupled to analog devices, such as various sensors and the semiconductor optical amplifiers 21, 41, and 126, through analog ports, control communication between the processing unit 1000 and these analog devices, and perform A/D and D/A conversion of the communication content.

The user interface 1010 may display progress in the programs executed by the processing unit 1000 for an operator so that the operator can instruct the processing unit 1000 to stop execution of the programs or to execute an interruption routine.

The exemplary hardware environment 100 may be applied to configurations such as the laser controller 3 according to some embodiments of the present disclosure. A person skilled in the art will appreciate that these controllers may be implemented in distributed computing environments, where tasks are implemented by processing units that are linked through a communications network. In some embodiments of the present disclosure, a controller and so forth for an exposure apparatus laser (not illustrated) that integrally controls the laser controller 3 and so forth may be coupled to each other through a communication network such as Ethernet (registered trademark) and the Internet. In a distributed computing environment, program modules may be stored in both local and remote memory storage devices.

7. Et Cetera

The above-described embodiments are non-limiting and are merely illustrative in nature. Therefore, it should be appreciated by a person skilled in the art that modifications may be made to the embodiments of the present disclosure without departing from the scope set forth by the appended claims.

The terms used throughout the specification and the appended claims are to be construed as "open-ended" terms. For example, the term "include" and its grammatical variants are intended to be non-limiting, such that recitation of items in a list is not to the exclusion of other like items that can be substituted or added to the listed items. The term "have" and its grammatical variants are intended to be non-limiting, such that recitation of items in a list is not to the exclusion of other like items that can be substituted or added to the listed items. Further, the singular forms "a", "an", and "the" used in the specification and the appended claims are to be construed as "at least one" or "one or more".

What is claimed is:

1. A solid-state laser system, comprising:
   a solid-state laser unit configured to output first pulsed laser light with a first wavelength and second pulsed laser light with a second wavelength;
   a first solid-state amplifier configured to receive the first pulsed laser light, and output third pulsed laser light with the first wavelength;
   a wavelength converter configured to receive the third pulsed laser light, and output harmonic light with a third wavelength;
   a second solid-state amplifier configured to receive the second pulsed laser light, and output fourth pulsed laser light with the second wavelength;
   a Raman laser unit configured to receive the fourth pulsed laser light, and output Stokes light with a fourth wavelength; and
   a wavelength conversion system configured to receive the harmonic light and the Stokes light, and output fifth pulsed laser light with a fifth wavelength converted in wavelength from the third wavelength and the fourth wavelength.

2. The solid-state laser system according to claim 1, wherein
   the first wavelength is in a range from 1032 nm to 1045 nm,
   the second wavelength is in a range from 1070 nm to 1093 nm,
   the harmonic light comprises fourth-harmonic light of the first pulsed laser light,
   the Raman laser unit comprises a diamond Raman laser unit,
   the Stokes light comprises second-Stokes light, and
   the fifth wavelength is in a range from 193 nm to 194 nm.

3. The solid-state laser system according to claim 1, wherein the solid-state laser unit includes:
   a first fiber amplifier system including a ytterbium-doped silica fiber, and configured to output the first pulsed laser light; and
   a second fiber amplifier system including a ytterbium-doped silica fiber, and configured to output the second pulsed laser light.

4. The solid-state laser system according to claim 1, wherein the solid state laser unit includes:
   a single fiber amplifier system including a ytterbium-doped silica fiber, and configured to output the first pulsed laser light and the second pulsed laser light; and
   an optical device provided downstream of the single fiber amplifier system, and configured to branch the first pulsed laser light and the second pulsed laser light.

5. The solid-state laser system according to claim 4, wherein the solid-state laser unit further includes:
   a first oscillator configured to output first seed light with the first wavelength;
   a first laser light generator configured to receive the first seed light, and output sixth pulsed laser light with the first wavelength;
   a second oscillator configured to output second seed light with the second wavelength; and
   a second laser light generator configured to receive the second seed light, and output seventh pulsed laser light with the second wavelength, and
   wherein the single fiber amplifier system receives the sixth pulsed laser light and the seventh pulsed laser light.

6. The solid-state laser system according to claim 4, wherein the solid-state laser unit further includes:
   a first oscillator configured to output first seed light with the first wavelength;
   a second oscillator configured to output second seed light with the second wavelength; and
   a single laser light generator configured to receive the first seed light and the second seed light, and output sixth pulsed laser light with the first wavelength and seventh pulsed laser light with the second wavelength, and
   wherein the single fiber amplifier system receives the sixth pulsed laser light and the seventh pulsed laser light.

7. The solid-state laser system according to claim 1, wherein the first solid-state amplifier and the second solid-state amplifier each include one of a ytterbium-doped crystal and a ytterbium-doped ceramic.

8. The solid-state laser system according to claim 7, wherein the first solid-state amplifier includes one or more materials selected from a group consisting of Yb:Lu$_2$O$_3$, Yb:LuScO$_3$, Yb:ScYLO, Yb:YScO$_3$, Yb:Y$_2$O$_3$, Yb:Lu$_2$SiO$_5$, Yb:Sc$_2$O$_3$, Yb:CaF$_2$, Yb:YLF, Yb:KGW, Yb:KYW, and Yb:YAG.

9. The solid-state laser system according to claim 7, wherein the second solid-state amplifier includes one or more materials selected from a group consisting of Yb:Lu$_2$O$_3$, Yb:LuScO$_3$, Yb:ScYLO, Yb:YScO$_3$, Yb:Y$_2$O$_3$, and Yb:Lu$_2$SiO$_5$.

10. The solid-state laser system according to claim 9, wherein
    the first solid-state amplifier includes one or more materials selected from a group consisting of Yb:Lu$_2$O$_3$, Yb:LuScO$_3$, Yb:ScYLO, Yb:YScO$_3$, Yb:Y$_2$O$_3$, and Yb:Lu$_2$SiO$_5$, and
    the one or more materials of the first solid-state amplifier and the one or more materials of the second solid-state amplifier are the same as each other.

11. The solid-state laser system according to claim 1, wherein the Raman laser unit includes:
    an optical resonator configured to resonate the Stokes light; and
    a diamond crystal provided in an optical path of the optical resonator, and configured to generate the Stokes light.

12. The solid-state laser system according to claim 11, wherein
    a thickness of the diamond crystal in a direction intersecting the optical path of the optical resonator is in a range from 0.41 mm to 2 mm, and
    a length of the diamond crystal in a direction of the optical path of the optical resonator is 8 mm or less.

13. A solid-state laser system, comprising:
    a solid-state laser unit configured to output first pulsed laser light with a first wavelength and second pulsed laser light with a second wavelength;
    a single solid-state amplifier configured to receive the first pulsed laser light and the second pulsed laser light, and output third pulsed laser light with the first wavelength and fourth pulsed laser light with the second wavelength;
    an optical device provided downstream of the single solid-state amplifier, and configured to branch the third pulsed laser light and the fourth pulsed laser light;
    a wavelength converter configured to receive the third pulsed laser light branched by the optical device, and output harmonic light with a third wavelength;

a Raman laser unit configured to receive the fourth pulsed laser light branched by the optical device, and output Stokes light with a fourth wavelength; and a wavelength conversion system configured to receive the harmonic light and the Stokes light, and output fifth pulsed laser light with a fifth wavelength converted in wavelength from the third wavelength and the fourth wavelength.

14. An excimer laser system, comprising:

a solid-state laser unit configured to output first pulsed laser light with a first wavelength and second pulsed laser light with a second wavelength;

a first solid-state amplifier configured to receive the first pulsed laser light, and output third pulsed laser light with the first wavelength;

a wavelength converter configured to receive the third pulsed laser light, and output harmonic light with a third wavelength;

a second solid-state amplifier configured to receive the second pulsed laser light, and output fourth pulsed laser light with the second wavelength;

a Raman laser unit configured to receive the fourth pulsed laser light, and output Stokes light with a fourth wavelength;

a wavelength conversion system configured to receive the harmonic light and the Stokes light, and output fifth pulsed laser light with a fifth wavelength converted in wavelength from the third wavelength and the fourth wavelength; and an excimer laser amplifier configured to receive the fifth pulsed laser light, and output pulsed laser light with the fifth wavelength.

15. An excimer laser system, comprising:

a solid-state laser unit configured to output first pulsed laser light with a first wavelength and second pulsed laser light with a second wavelength;

a single solid-state amplifier configured to receive the first pulsed laser light and the second pulsed laser light, and output third pulsed laser light with the first wavelength and fourth pulsed laser light with the second wavelength;

an optical device provided downstream of the single solid-state amplifier, and configured to branch the third pulsed laser light and the fourth pulsed laser light;

a wavelength converter configured to receive the third pulsed laser light branched by the optical device, and output harmonic light with a third wavelength;

a Raman laser unit configured to receive the fourth pulsed laser light branched by the optical device, and output Stokes light with a fourth wavelength;

a wavelength conversion system configured to receive the harmonic light and the Stokes light, and output fifth pulsed laser light with a fifth wavelength converted in wavelength from the third wavelength and the fourth wavelength; and an excimer laser amplifier configured to receive the fifth pulsed laser light, and output pulsed laser light with the fifth wavelength.

* * * * *